US012068189B2

(12) United States Patent
Yamaki et al.

(10) Patent No.: US 12,068,189 B2
(45) Date of Patent: Aug. 20, 2024

(54) ELASTIC MEMBRANE, SUBSTRATE HOLDING DEVICE, AND POLISHING APPARATUS

(71) Applicant: EBARA CORPORATION, Tokyo (JP)

(72) Inventors: Satoru Yamaki, Tokyo (JP); Makoto Fukushima, Tokyo (JP); Keisuke Namiki, Tokyo (JP); Osamu Nabeya, Tokyo (JP); Shingo Togashi, Tokyo (JP); Tomoko Owada, Tokyo (JP); Yoshikazu Kato, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 507 days.

(21) Appl. No.: 17/371,518

(22) Filed: Jul. 9, 2021

(65) Prior Publication Data

US 2021/0335650 A1 Oct. 28, 2021

Related U.S. Application Data

(63) Continuation of application No. 15/950,989, filed on Apr. 11, 2018, now Pat. No. 11,088,011.

(30) Foreign Application Priority Data

Apr. 12, 2017 (JP) ................................ 2017-078933
Mar. 8, 2018 (JP) ................................ 2018-042410

(51) Int. Cl.
*H01L 21/687* (2006.01)
*B24B 7/04* (2006.01)
(Continued)

(52) U.S. Cl.
CPC .......... *H01L 21/68707* (2013.01); *B24B 7/04* (2013.01); *B24B 37/107* (2013.01); *B24B 37/30* (2013.01)

(58) Field of Classification Search
CPC ......... B24B 37/04; B24B 37/27; B24B 37/30; B24B 37/32; B24B 37/34; B24B 55/00;
(Continued)

(56) References Cited

U.S. PATENT DOCUMENTS 6,165,058 A 12/2000 Zuniga et al.
6,443,821 B1 9/2002 Kimura et al.
(Continued)

FOREIGN PATENT DOCUMENTS

CN 104942704 A 9/2015
CN 204954604 U 1/2016
(Continued)

OTHER PUBLICATIONS

CN205148039—Machine Translation (Year: 2016).*
Singapore Patent Application No. 10201802986Y; Search Report and Written Opinion; dated Apr. 6, 2020; 9 pages.

*Primary Examiner* — Brian D Keller
*Assistant Examiner* — Alberto Saenz
(74) *Attorney, Agent, or Firm* — BakerHostetler

(57) ABSTRACT

An elastic membrane to be used for a polishing head includes a contact portion configured to come into contact with a wafer, an annular side wall provided to stand on an outer peripheral end of the contact portion, a first partition wall linearly extending inward in a radial direction in sectional view from the side wall, and a second partition wall linearly extending inward and upward in the radial direction in sectional view from an outer peripheral end portion of the contact portion, wherein the first partition wall, the second partition wall, and the side wall constitute an edge pressure chamber for pressing an edge of the wafer.

4 Claims, 38 Drawing Sheets

(51) Int. Cl.
*B24B 37/10* (2012.01)
*B24B 37/30* (2012.01)

(58) Field of Classification Search
CPC ............... H01L 21/68721; H01L 21/6835; H01L 21/68
USPC .................. 451/12, 285, 287, 288, 397, 398
See application file for complete search history.

(56) References Cited

U.S. PATENT DOCUMENTS

| | | |
|---|---|---|
| 7,255,771 B2 | 8/2007 | Chen et al. |
| 7,727,055 B2 | 6/2010 | Zuniga et al. |
| 7,867,063 B2 | 1/2011 | Togawa et al. |
| 7,950,985 B2 | 5/2011 | Zuniga et al. |
| 9,573,244 B2 | 2/2017 | Fukushima et al. |
| 2005/0211377 A1 | 9/2005 | Chen et al. |
| 2006/0199479 A1 | 9/2006 | Togawa et al. |
| 2007/0232193 A1 | 10/2007 | Yasuda et al. |
| 2015/0273657 A1 | 10/2015 | Fukushima et al. |

FOREIGN PATENT DOCUMENTS

| | | | | |
|---|---|---|---|---|
| CN | 205148039 U | * | 4/2016 | ........... H01L 21/304 |
| CN | 205148039 U | | 4/2016 | |
| CN | 304345271 S | | 11/2017 | |
| JP | 2007-268654 A | | 10/2007 | |
| JP | 2013-111679 A | | 6/2013 | |
| JP | 2015-193070 A | | 11/2015 | |
| KR | 2015-0112837 A | | 10/2015 | |
| KR | 2016-0076372 A | | 6/2016 | |
| SG | 10201708713 X | | 5/2018 | |
| TW | 510842 B | | 11/2002 | |
| TW | 201248766 A | | 12/2012 | |
| TW | 201536475 A | | 10/2015 | |

\* cited by examiner

ELASTIC MEMBRANE, SUBSTRATE HOLDING DEVICE, AND POLISHING APPARATUS

CROSS REFERENCE TO RELATED APPLICATION

This nonprovisional application is a continuation of U.S. patent application Ser. No. 15/950,989, filed Apr. 11, 2018 which is based on Japanese Patent Application No. 2018-042410 filed with the Japan Patent Office on Mar. 8, 2018 and Japanese Patent Application No. 2017-078933 filed with the Japan Patent Office on Apr. 12, 2017, the entire contents of which are hereby incorporated by reference.

FIELD

The present invention relates to a polishing apparatus for polishing a substrate such as a wafer, a substrate holding device for holding the substrate in the polishing apparatus, and an elastic membrane used for the substrate holding device.

BACKGROUND AND SUMMARY

In recent years, interconnection of circuits has become finer and the total number of multilayer interconnection is also increasing with realization of higher integration and higher density of semiconductor devices. When realizing multilayer interconnection while achieving miniaturization of a circuit, a step becomes larger by following surface unevenness of a lower layer. Therefore, film coverage (step coverage) with respect to a step shape in thin film formation becomes worse as the total number of multilayer interconnection increases. Therefore, to realize the multilayer interconnection, the step coverage needs to be improved and planarization processing needs to be performed in a proper process. In addition, the depth of focus becomes shallow with the miniaturization of photolithography. Therefore, the planarization processing needs to be performed on a surface of a semiconductor device so that an uneven step in the surface of the semiconductor device falls within the depth of focus.

Therefore, in the semiconductor device manufacturing process, planarization of the surface of the semiconductor device is becoming increasingly important. One of the most important techniques in the planarization of the surface is chemical mechanical polishing (CMP). In the chemical mechanical polishing, polishing is performed by bringing a wafer into sliding contact with a polishing surface of a polishing pad while supplying a polishing liquid containing abrasive grains such as silica (SiO2) onto the polishing surface.

A polishing apparatus for performing the CMP includes a polishing table for supporting the polishing pad and a substrate holding device called top ring or polishing head for holding the wafer. When polishing the wafer using such a polishing apparatus, the wafer is pressed against the polishing surface of the polishing pad with a predetermined pressure while holding the wafer by the substrate holding device. At this time, the wafer is brought into sliding contact with the polishing surface by a relative motion of the polishing table and the substrate holding device, and the surface of the wafer is polished.

In the case where a relative pressing force between the wafer being polished and the polishing surface of the polishing pad is not uniform over the entire surface of the wafer, insufficient polishing or overpolishing occurs depending on the pressing force applied to each part of the wafer. In view of this, to equalize the pressing force on the wafer, a pressure chamber formed of an elastic membrane is provided in a lower part of a substrate holding device, and a fluid such as air is supplied to the pressure chamber, thereby to press a wafer by a fluid pressure via the elastic membrane (for example, see JP 2015-193070 A).

FIG. 23 is a sectional view illustrating a substrate holding device of a polishing apparatus described in JP 2015-193070 A, and FIG. 24 is an enlarged sectional view of an edge portion of an elastic membrane of FIG. 23. As illustrated in FIG. 23, a conventional elastic membrane 110 is attached to a lower surface of a head body 102, and includes a contact portion 111 formed in a circular shape in accordance with a shape of a wafer and a side wall 110h provided to stand from the contact portion 111. A lower surface of the contact portion 111 of the elastic membrane 110 serves as a bottom surface of the elastic membrane 110, and the lower surface of the contact portion 111 presses the wafer downward to press the wafer against a polishing surface of a polishing pad.

As illustrated in FIGS. 23 and 24, a plurality of concentric partition walls 120a to 120g extending upward is provided at intervals in the contact portion 111, and the side wall 110h extending upward is formed at an outer peripheral end of the contact portion 111. Pressure chambers 116a to 116g are formed between the partition walls 120a to 120g, and an edge pressure chamber 116g is formed between the outermost partition wall and the side wall in an outer peripheral end portion. Then, a pressure in each of the pressure chambers 116a to 116g is controlled by separately sending air from the head body 102 to each of the pressure chambers 116a to 116g. By controlling the pressure in each of the pressure chambers 116a to 116g, a pressing force of each bottom surface portion corresponding to each of the pressure chambers 116a to 116g is controlled.

In the polishing apparatus including the elastic membrane of the above-described conventional constitution, the polishing pad has elasticity and thus the pressing force applied to an edge portion (peripheral edge portion) of the wafer being polished becomes uneven, and so-called "edge sagging" in which only the edge portion of the wafer is intensively polished occurs in some cases. To prevent such edge sagging, it is advantageous to control the pressing force with a finer range at the outer peripheral end portion of the elastic membrane that presses the edge portion of the wafer.

FIG. 25 is an enlarged sectional view of an edge portion of an elastic membrane of another example disclosed in JP 2015-193070 A. In this example, the partition wall 120f extends from a position closer to the outer peripheral end of the contact portion 111, and the edge pressure chamber 116g can press the edge portion of the wafer in a relatively narrow range, as compared with the example of FIG. 24.

An object of the present invention is to provide a polishing apparatus capable of precisely adjusting a polishing profile especially in an edge portion of a substrate, a substrate holding device used for such a polishing apparatus, and an elastic membrane used for such a substrate holding device.

One aspect of the present invention is an elastic membrane to be used for a substrate holding device, the elastic membrane including a contact portion configured to come into contact with a substrate, an annular side wall provided to stand on an outer peripheral end of the contact portion, a first partition wall linearly extending inward in a radial direction in sectional view from the side wall, and a second partition wall linearly extending inward and upward in the radial direction in sectional view from an outer peripheral end portion of the contact portion, wherein the first partition wall, the second partition wall, and the side wall constitute an edge pressure chamber for pressing an edge of the substrate.

With the constitution, a pressure in the edge pressure chamber is controlled, whereby a pressing force of the contact portion can be controlled within a narrow range in the outer peripheral end portion. Further, since the first partition wall and the second partition wall linearly extend in sectional view, the first partition wall and the second partition wall are less likely to come in contact with each other, and therefore pressure control of the edge pressure chamber can be easily performed. Further, even if the pressure in the edge pressure chamber becomes high, expansion of the side wall to the outside can be suppressed because the first partition wall linearly extends from the side wall.

In the above-described elastic membrane, an interval between the first partition wall and the second partition wall may gradually increase from an inside in the radial direction of the contact portion to an outside in the radial direction.

With the constitution, air easily spreads throughout a space in the edge pressure chamber, and a pressing force of the contact portion can be controlled within a narrow range in the outer peripheral end portion.

In the above-described elastic membrane, the substrate holding device may include a head body to which the elastic membrane is attached, the first partition wall may include a first engaging portion on a distal end to be engaged with the head body, the second partition wall may include a second engaging portion on a distal end to be engaged with the head body, and an interval between the first partition wall and the second partition wall may gradually increase from the first engaging portion and the second engaging portion toward the side wall.

Also with the constitution, air easily spreads throughout a space in the edge pressure chamber, and a pressing force of the contact portion can be controlled within a narrow range in the outer peripheral end portion.

In the above-described elastic membrane, the second partition wall may linearly extend from a position on an inner side by 0.5 to 1.5 mm from an inner peripheral surface of the side wall.

With the constitution, a pressing force of a bottom surface can be controlled within a narrow range in the outer peripheral end portion, having a portion inside by from 0.5 to 1.5 mm from the outer peripheral end of the elastic membrane (an edge pressing width d) as the outer peripheral end portion.

In the above-described elastic membrane, a distance between an outer peripheral surface of the second partition wall and an inner peripheral surface of the side wall on an upper surface of the contact portion may be 1.5 to 8 mm.

With this constitution, the polishing profile in the outer peripheral end portion of the film can also be precisely controlled regarding a substrate on which no film is formed on the outer peripheral end portion.

In the above-described elastic membrane, a proximal end portion at which the second partition wall is connected to the upper surface of the contact portion may be bent to form a proximal end connection portion, and a length of the proximal end connection portion may be 0.5 to 3.5 mm.

With the constitution, a distance between the second partition wall and an adjacent partition wall can be secured so that the second partition wall and the adjacent wall do not come in contact with each other.

In the above-described elastic membrane, an outer peripheral surface of the side wall constituting the edge pressure chamber may be flat.

With the constitution, there is no step in the side wall, and therefore slurry, which becomes a cause of defect, is less likely to be accumulated.

Another aspect of the present invention is a substrate holding device that holds a substrate, and the substrate holding device includes the above-described elastic membrane, and a head body to which the elastic membrane is attached.

Also with the constitution, a pressure in the pressure chamber is controlled, whereby a pressing force of the contact portion can be controlled within a narrow range in the outer peripheral end portion. Further, since the first partition wall and the second partition wall linearly extend, the first partition wall and the second partition wall are less likely to come in contact with each other, and therefore pressure control of the pressure chamber can be easily performed. Even if the pressure in the edge pressure chamber becomes high, expansion of the side wall to the outside can be suppressed because the first partition wall linearly extends from the side wall.

Still another aspect of the present invention is a polishing apparatus that polishes a substrate, the polishing apparatus including a polishing table configured to support a polishing pad having a polishing surface, and the above-described substrate holding device, wherein the polishing apparatus brings the substrate into sliding contact with the polishing surface to polish a surface of the substrate by pressing the substrate toward the polishing surface with a predetermined pressure force and causing the polishing table and the substrate holding device to perform a relative motion while holding the substrate by the substrate holding device.

Also with the constitution, a pressure in the pressure chamber is controlled, whereby a pressing force of the contact portion can be controlled within a narrow range in the outer peripheral end portion. Further, since the first partition wall and the second partition wall linearly extend, the first partition wall and the second partition wall are less likely to come in contact with each other, and therefore pressure control of the pressure chamber can be easily performed. Even if the pressure in the edge pressure chamber becomes high, expansion of the side wall to the outside can be suppressed because the first partition wall linearly extends from the side wall.

According to the present invention, a pressure in the pressure chamber is controlled, whereby a pressing force of the contact portion can be controlled within a narrow range in the outer peripheral end portion. Further, since the first partition wall and the second partition wall linearly extend, the first partition wall and the second partition wall are less likely to come in contact with each other, and therefore pressure control of the pressure chamber can be easily performed. Even if the pressure in the edge pressure chamber becomes high, expansion of the side wall to the outside can be suppressed because the first partition wall linearly extends from the side wall.

The foregoing and other objects, features, aspects and advantages of the exemplary embodiments will become more apparent from the following detailed description of the exemplary embodiments when taken in conjunction with the accompanying drawings.

DETAILED DESCRIPTION OF NON-LIMITING EXAMPLE EMBODIMENTS

Hereinafter, embodiments of the present invention will be described with reference to the drawings. Note that the embodiments described below are merely examples for implementing the present invention, and the present invention is not limited to specific constitutions described below. In implementing the present invention, a specific constitution according to an embodiment may be appropriately adopted.

Figure 1:
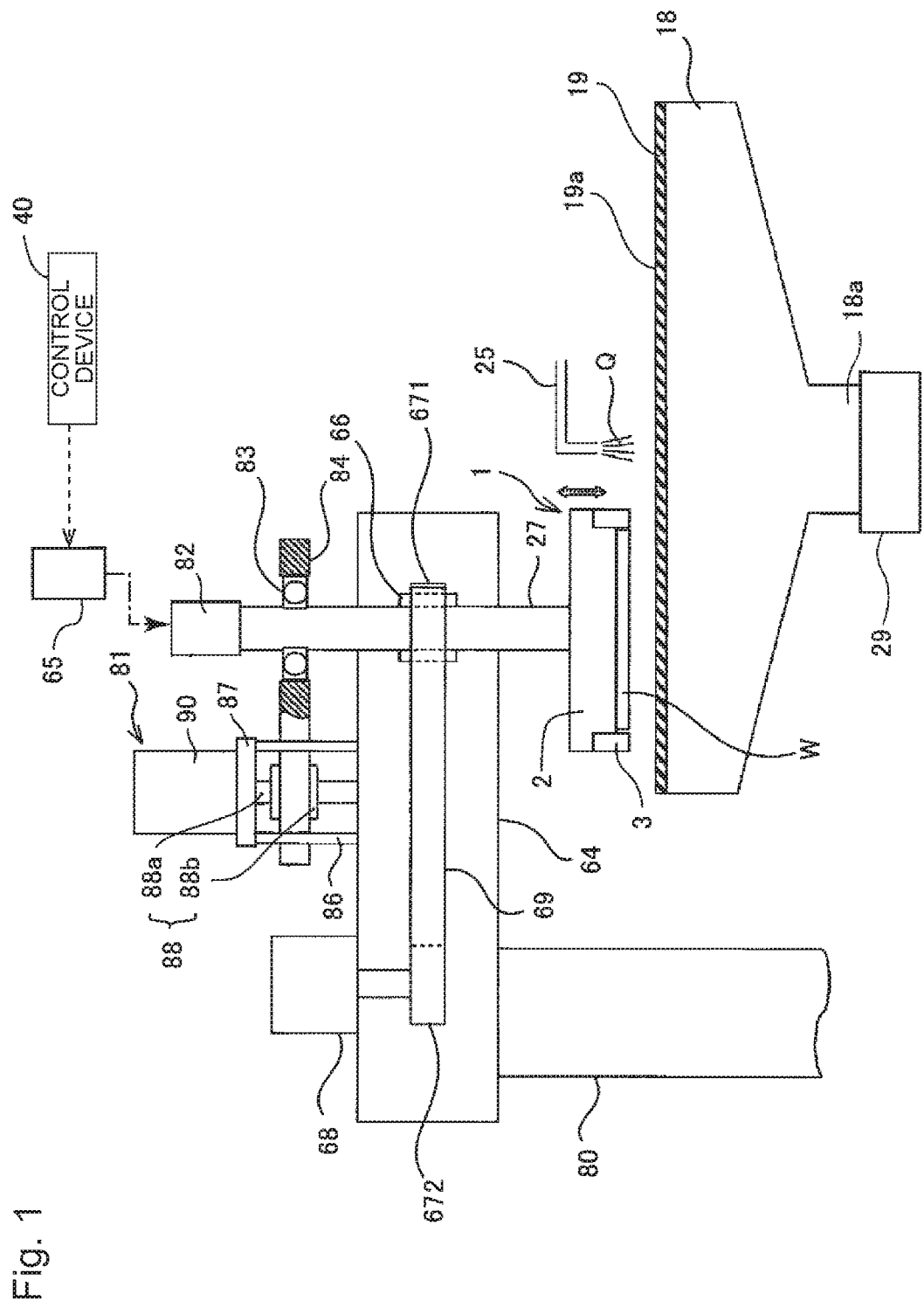
FIG. 1 is a view illustrating a polishing apparatus according to an embodiment of the present invention.

FIG. 1 is a view illustrating a polishing apparatus according to an embodiment. As illustrated in FIG. 1, the polishing apparatus includes a polishing table 18 that supports a polishing pad 19, and a substrate holding device 1 that holds a wafer W as an example of a substrate that is an object to be polished and presses the wafer W against the polishing pad 19 on the polishing table 18. In the following description, the substrate holding device 1 is referred to as a polishing head 1.

The polishing table 18 is connected via a table shaft 18a to a table motor 29 disposed below the table shaft 18a and is rotatable around the table shaft 18a. The polishing pad 19 is affixed to an upper surface of the polishing table 18, and a surface 19a of the polishing pad 19 constitutes a polishing surface for polishing the wafer W. A polishing liquid supply nozzle 25 is installed above the polishing table 18, and a polishing liquid Q is supplied onto the polishing pad 19 on the polishing table 18 through the polishing liquid supply nozzle 25.

The polishing head 1 includes a head body 2 that presses the wafer W against the polishing surface 19a, and a retainer ring 3 that holds the wafer W to prevent the wafer W from slipping out of the polishing head 1. The polishing head 1 is connected to a head shaft 27, and the head shaft 27 is moved up and down with respect to a head arm 64 by an up-down motion mechanism 81. With the up-down motion of the head shaft 27, the entire polishing head 1 is lifted and positioned relative to the head arm 64. A rotary joint 82 is attached to an upper end of the head shaft 27.

The up-down motion mechanism 81 that moves the head shaft 27 and the polishing head 1 up and down includes a bridge 84 rotatably supporting the head shaft 27 via a bearing 83, a ball screw 88 attached to the bridge 84, a support base 87 supported by a support 86, and a servo motor 90 provided on the support base 87. The support base 87 that supports the servo motor 90 is fixed to the head arm 64 via the support 86.

The ball screw 88 includes a screw shaft 88a connected to the servo motor 90 and a nut 88b to which the screw shaft 88a is screwed. The head shaft 27 is moved up and down integrally with the bridge 84. Therefore, when the servo motor 90 is driven, the bridge 84 is moved up and down via the ball screw 88, whereby the head shaft 27 and the polishing head 1 are moved up and down.

The head shaft 27 is connected to a rotating cylinder 66 via a key (not illustrated). The rotating cylinder 66 includes a timing pulley 671 on its outer peripheral portion. A head motor 68 is fixed to the head arm 64, and the timing pulley 671 is connected to a timing pulley 672 provided to the head motor 68 via a timing belt 69. Therefore, by driving and rotating the head motor 68, the rotating cylinder 66 and the head shaft 27 are integrally rotated via the timing pulley 672, the timing belt 69, and the timing pulley 671, and the polishing head 1 is rotated. The head arm 64 is supported by an arm shaft 80 rotatably supported by a frame (not illustrated). The polishing apparatus includes a control device 40 that controls the devices in the apparatus, such as the head motor 68 and the servo motor 90.

The polishing head 1 is constituted to be able to hold the wafer W on its lower surface. The head arm 64 is swingable about the arm shaft 80, and the polishing head 1 holding the wafer W on the lower surface is moved between a receiving position of the wafer W and an upper position of the polishing table 18 by swing of the head arm 64.

Polishing of the wafer W is performed as follows. The polishing head 1 and the polishing table 18 are rotated, and the polishing liquid Q is supplied through the polishing liquid supply nozzle 25 provided above the polishing table 18 onto the polishing pad 19. In this state, the polishing head 1 is lowered to a predetermined position (predetermined height), and the wafer W is pressed against the polishing surface 19a of the polishing pad 19 at this predetermined position. The wafer W is brought into sliding contact with the polishing surface 19a of the polishing pad 19, whereby the surface of the wafer W is polished.

Figure 2:
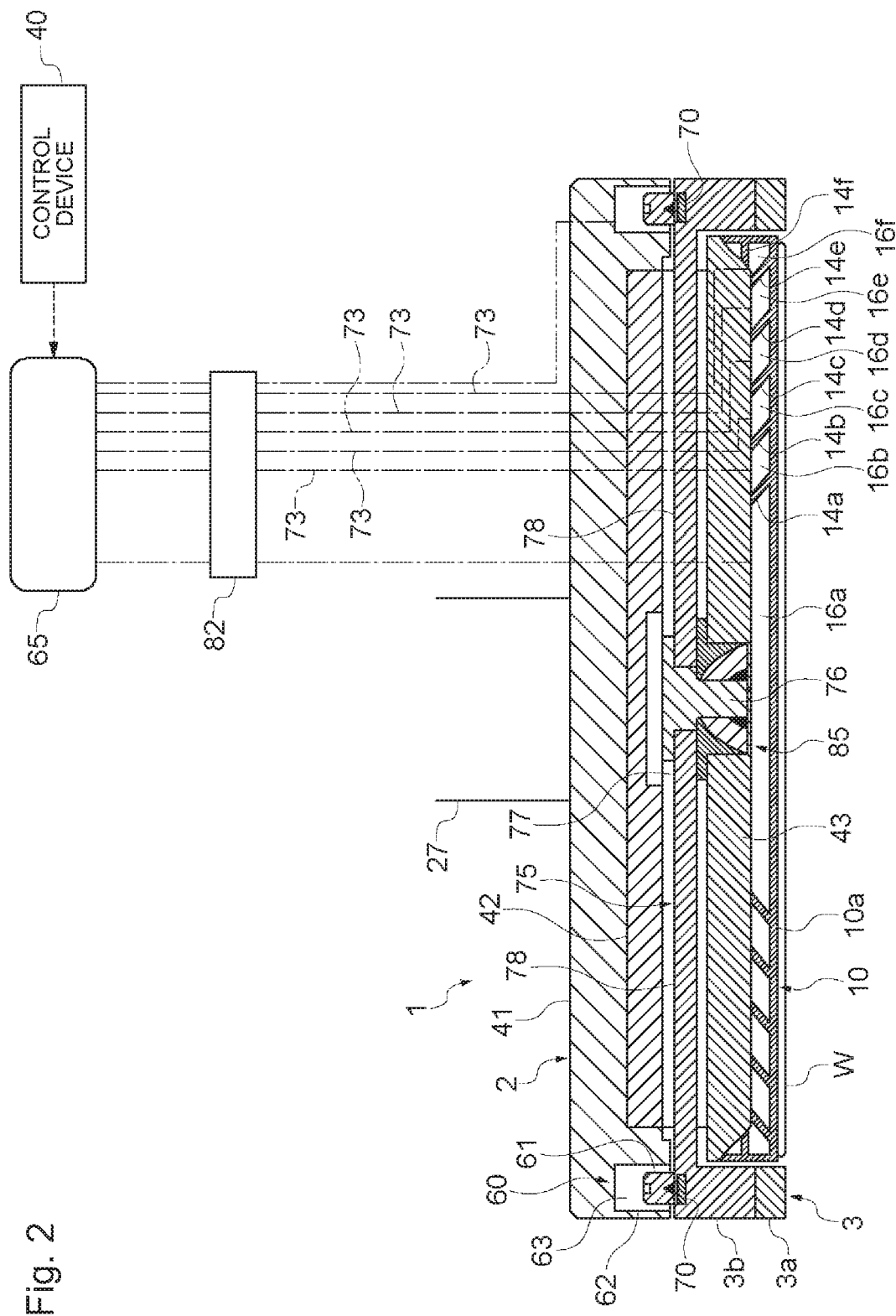
FIG. 2 is a view illustrating a polishing head (substrate holding device) provided in the polishing apparatus illustrated in FIG. 1.

Next, the polishing head 1 will be described. FIG. 2 is a schematic sectional view of the polishing head (substrate holding device) 1. As illustrated in FIG. 2, the polishing head 1 includes the head body 2 that presses the wafer W against the polishing surface 19a, and the retainer ring 3 arranged to surround the wafer W. The head body 2 and the retainer ring 3 are integrally rotated by the rotation of the head shaft 27. The retainer ring 3 is constituted to be movable up and down independently of the head body 2.

The head body 2 includes a circular flange 41, a spacer 42 attached to a lower surface of the flange 41, and a carrier 43 attached to a lower surface of the spacer 42. The flange 41 is connected to the head shaft 27. The carrier 43 is connected to the flange 41 via the spacer 42, and the flange 41, the spacer 42, and the carrier 43 are integrally rotated and integrally moved up and down. The head body 2 including the flange 41, the spacer 42, and the carrier 43 is formed of a resin such as engineering plastic (for example, PEEK). Note that the flange 41 may be formed of SUS or a metal such as aluminum.

An elastic membrane 10 that comes into contact with a back surface of the wafer W is connected to the lower surface of the head body 2. A method of connecting the elastic membrane 10 to the head body 2 will be described below. A lower surface of a circular contact portion 11 of the elastic membrane 10 is a contact surface that comes into contact with the wafer W, and constitutes a substrate holding surface 10a. A side wall 15 is provided to stand from an outer peripheral end of the contact portion 11. The elastic membrane 10 includes a plurality of (six in FIG. 2) annular partition walls 14a, 14b, 14c, 14d, 14e, and 14f, and these partition walls 14a to 14f are concentrically arranged. The partition walls 14a to 14e extend upward from an upper surface of the contact portion 11, and the partition wall 14f extends inward in a radial direction from the side wall 15. These partition walls 14a to 14f form seven pressure chambers between the elastic membrane 10 and the head body 2. That is, a circular central pressure chamber 16a located at the center, annular edge pressure chambers 16f and 16g located at an outermost periphery, and intermediate pressure chambers 16b, 16c, 16d, and 16e located between the central pressure chamber 16a and the edge pressure chamber 16f are formed. The edge pressure chamber 16g is formed above the edge pressure chamber 16f.

These pressure chambers 16a to 16g are connected to a pressure adjustment device 65 via the rotary joint 82. A fluid (for example, a gas, more specifically, air or nitrogen) is supplied through fluid lines 73 extending from the pressure adjustment device 65 to the pressure chambers 16a to 16g. The pressure adjustment device 65 is connected to the control device 40 and can independently adjust pressures in the seven pressure chambers 16a to 16g. Further, the pressure adjustment device 65 can form negative pressures in the pressure chambers 16a to 16g. In this manner, in the polishing head 1, the pressure of the fluid to be supplied to each of the pressure chambers 16a to 16g formed between the head body 2 and the elastic membrane 10 is adjusted, whereby the pressing force to be applied to the wafer W can be adjusted on a region to region basis of the wafer W.

The elastic membrane 10 is formed of a rubber material having excellent strength and durability, such as ethylene propylene rubber (EPDM), polyurethane rubber, or silicone rubber. Each of the pressure chambers 16a to 16g is also connected to an atmospheric release mechanism (not illustrated), so that the pressure chambers 16a to 16g can be opened to the atmosphere.

An upper portion of the retainer ring 3 is connected to an annular retainer ring pressing mechanism 60. The retainer ring pressing mechanism 60 applies a uniform downward load to an entire upper surface of the retainer ring 3 (more specifically, to an entire upper surface of a drive ring 3b), thereby to press a lower surface of the retainer ring 3 (that is, a lower surface of a ring member 3a) against the polishing surface 19a of the polishing pad 19.

The retainer ring pressing mechanism 60 includes an annular piston 61 fixed to an upper portion of the drive ring 3b and an annular rolling diaphragm 62 connected to an upper surface of the piston 61. A retainer ring pressure chamber 63 is formed inside the rolling diaphragm 62. The retainer ring pressure chamber 63 is connected to the pressure adjustment device 65 via the rotary joint 82. When a fluid (for example, air) is supplied from the pressure adjustment device 65 to the retainer ring pressure chamber 63, the rolling diaphragm 62 pushes down the piston 61 downward, and further the piston 61 pushes down the entire retainer ring 3 downward.

In this manner, the retainer ring pressing mechanism 60 presses the lower surface of the retainer ring 3 against the polishing surface 19a of the polishing pad 19. Further, by forming a negative pressure in the retainer ring pressure chamber 63 by the pressure adjustment device 65, the entire retainer ring 3 can be raised. The retainer ring pressure chamber 63 is also connected to an atmospheric release mechanism (not illustrated), so that the retainer ring pressure chamber 63 can be opened to the atmosphere.

The retainer ring 3 is detachably connected to the retainer ring pressing mechanism 60. More specifically, the piston 61 is formed of a magnetic material such as metal, and a plurality of magnets 32 is arranged on the upper portion of the drive ring 3b. As the magnets 32 attract the piston 61, the retainer ring 3 is fixed by a magnetic force of the piston 61. As the magnetic material of the piston 61, corrosion-resistant magnetic stainless steel is used, for example. Note that the drive ring 3b may be formed of the magnetic material and the magnets may be arranged on the piston 61.

Figure 3:
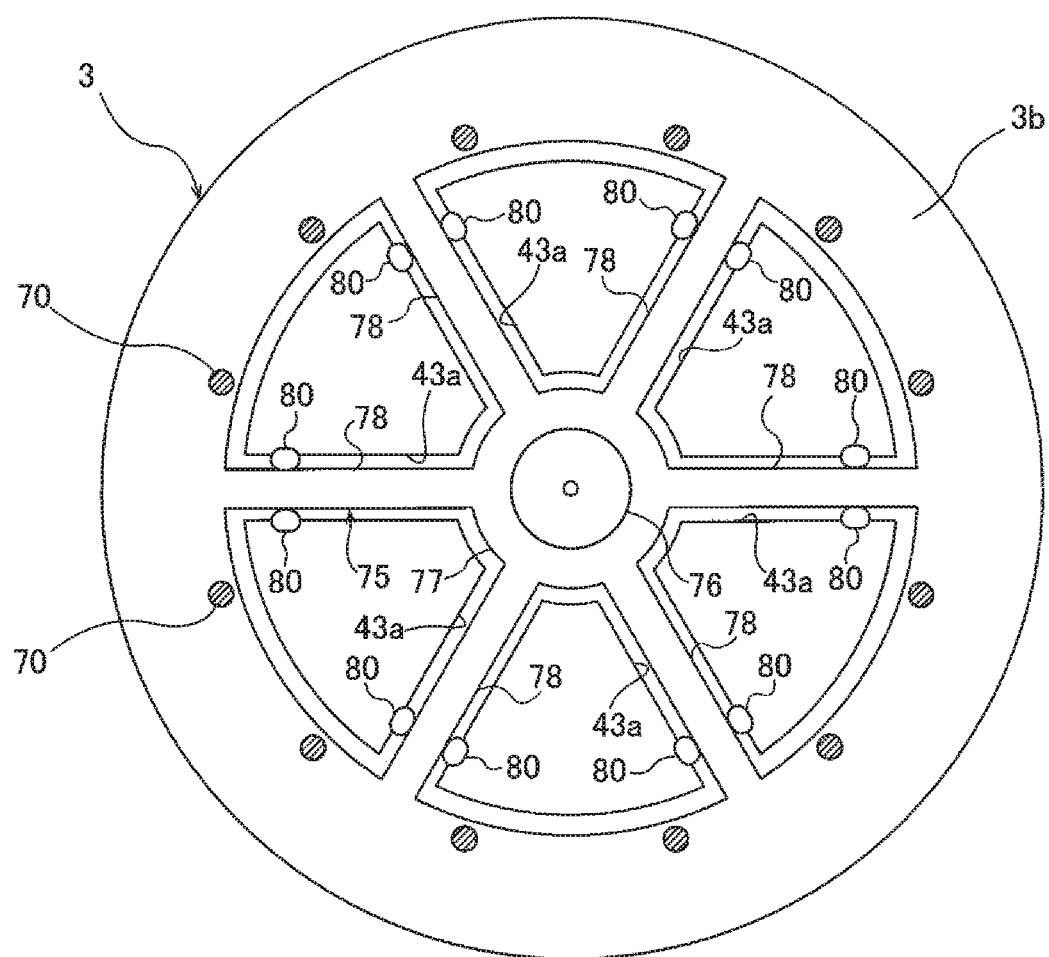
FIG. 3 is a plan view illustrating a retainer ring and a coupling ring illustrated in FIG. 2.

The retainer ring 3 is connected to a spherical bearing 85 via a coupling member 75. The spherical bearing 85 is arranged on an inner side of the retainer ring 3 in the radial direction. FIG. 3 is a plan view illustrating the retainer ring 3 and the coupling member 75. As illustrated in FIG. 3, the coupling member 75 includes a shaft portion 76 arranged in a central portion of the head body 2, a hub 77 fixed to the shaft portion 76, and a plurality of (six in the illustrated example) spokes 78 radially extending from the hub 77.

One end portion of the spoke 78 is fixed to the hub 77 and the other end portion of the spoke 78 is fixed to the drive ring 3b of the retainer ring 3. The hub 77, the spokes 78, and the drive ring 3b are integrally formed. A plurality of pairs of drive pins 80 and 80 is fixed to the carrier 43. The drive pins 80 and 80 of each pair are arranged on both sides of each spoke 78, and rotation of the carrier 43 is transmitted to the retainer ring 3 via the drive pins 80 and 80, whereby the head body 2 and the retainer ring 3 are integrally rotated.

As illustrated in FIG. 2, the shaft portion 76 extends in the spherical bearing 85 in a longitudinal direction. As shown in FIG. 3, in the carrier 43, a plurality of radial grooves 43a in which the spokes 78 are accommodated is formed, and each spoke 78 is movable in each groove 43a in the longitudinal direction. The shaft portion 76 of the coupling member 75 is movably supported in the longitudinal direction by the spherical bearing 85 arranged in the central portion of the head body 2. With the constitution, the coupling member 75 and the retainer ring 3 fixed thereto are movable in the longitudinal direction with respect to the head body 2. Further, the retainer ring 3 is tiltably supported by the spherical bearing 85.

Figure 4:
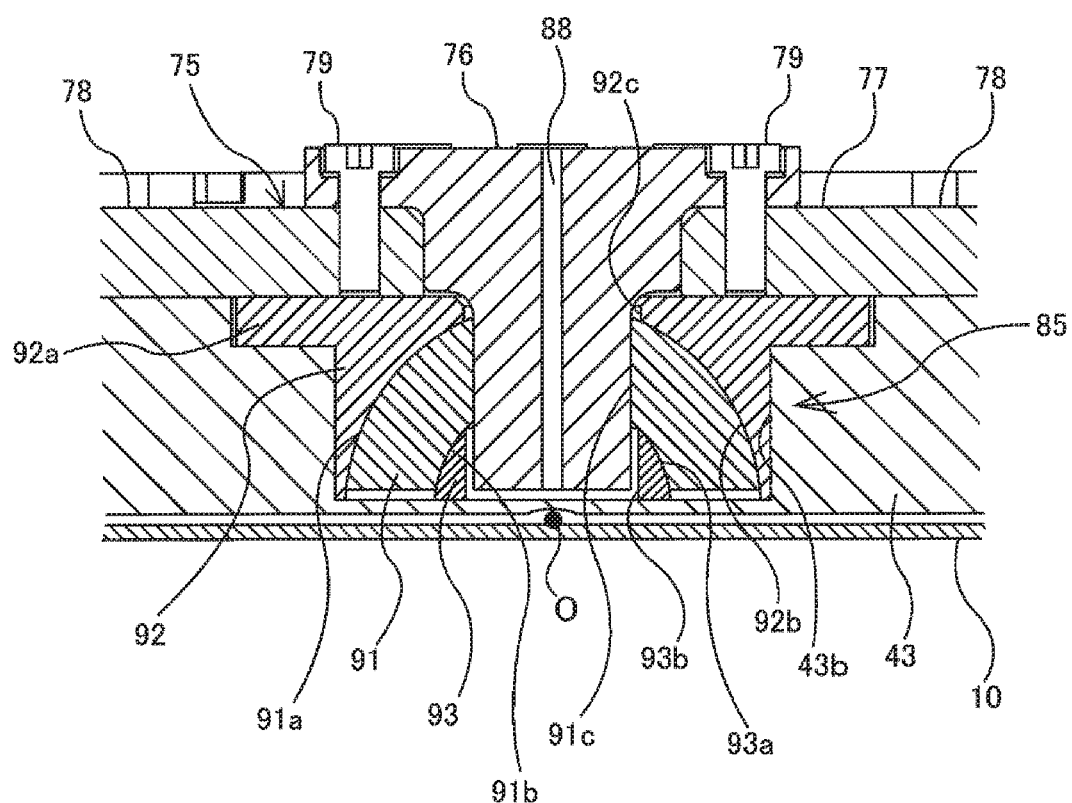
FIG. 4 is an enlarged sectional view of a part of a spherical bearing and the coupling ring illustrated in FIG. 2.

Hereinafter, the spherical bearing 85 will be described in more detail. FIG. 4 is an enlarged sectional view of a part of the spherical bearing 85 and the coupling member 75. As illustrated in FIG. 4, the shaft portion 76 is fixed to the hub 77 with a plurality of screws 79. A through hole 88 extending in the longitudinal direction is formed in the shaft portion 76. The through hole 88 functions as an air vent hole when the shaft portion 76 is moved in the longitudinal direction with respect to the spherical bearing 85, and the retainer ring 3 can be smoothly moved in the longitudinal direction with respect to the head body 2 with the function of the through hole 88.

The spherical bearing 85 includes an intermediate ring 91 connected to the retainer ring 3 via the coupling member 75, an outer ring 92 slidably supporting the intermediate ring 91 from above, and an inner ring 93 slidably supporting the intermediate ring 91 from below. The intermediate ring 91 has a partial spherical shell shape smaller than an upper half of a spherical shell and is sandwiched between the outer ring 92 and the inner ring 93.

A recessed portion 43b is formed in a central portion of the carrier 43, and the outer ring 92 is arranged in the recessed portion 43b. The outer ring 92 has a flange 92a on its outer peripheral portion. By fixing the flange 92a to a step portion of the recessed portion 43b with a bolt (not illustrated), the outer ring 92 is fixed to the carrier 43 and can apply a pressure to the intermediate ring 91 and the inner ring 93. The inner ring 93 is arranged on a bottom surface of the recessed 43b and supports the intermediate ring 91 from below to form a gap between a lower surface of the intermediate ring 91 and the bottom surface of the recessed portion 43b.

An inner surface 92b of the outer ring 92, an outer surface 91a and an inner surface 91b of the intermediate ring 91, and an outer surface 93a of the inner ring 93 are constituted by substantially hemispherical surfaces centering on a fulcrum O. The outer surface 91a of the intermediate ring 91 is slidably in contact with the inner surface 92b of the outer ring 92, and the inner surface 91b of the intermediate ring 91 is slidably in contact with the outer surface 93a of the inner ring 93. The inner surface 92b (sliding contact surface) of the outer ring 92, the outer surface 91a and the inner surface 91b (sliding contact surfaces) of the intermediate ring 91, and the outer surface 93a (sliding contact surface) of the inner ring 93 have partial spherical shapes smaller than upper halves of spherical surfaces. With the constitution, the intermediate ring 91 is tiltable in all directions (360°) with respect to the outer ring 92 and the inner ring 93, and the fulcrum O that is a tilting center is located lower than the spherical bearing 85.

Through holes 92c, 91c, and 93b into which the shaft portion 76 is inserted are respectively formed in the outer ring 92, the intermediate ring 91, and the inner ring 93. A gap is formed between the through hole 92c of the outer ring 92 and the shaft portion 76. Similarly, a gap is formed between the through hole 93b of the inner ring 93 and the shaft portion 76. The through hole 91c of the intermediate ring 91 has a smaller diameter than the through holes 92c and 93b of the outer ring 92 and the inner ring 93, and the shaft portion 76 is movable only in the longitudinal direction with respect to the intermediate ring 91. Therefore, the retainer ring 3 connected to the shaft portion 76 is not substantially allowed to move in a lateral direction, and the position in the lateral direction (horizontal direction) of the retainer ring 3 is fixed by the spherical bearing 85.

The spherical bearing 85 allows up-down movement and tilting of the retainer ring 3 while restricting movement in the lateral direction (movement in the horizontal direction) of the retainer ring 3. During polishing of the wafer W, the retainer ring 3 receives a force in the lateral direction (a force toward the outside in the radial direction of the wafer W) caused by friction between the wafer W and the polishing pad 19 from the wafer W. This force in the lateral direction is received by the spherical bearing 85. In this way, the spherical bearing 85 functions as a support mechanism that restricts the movement in the lateral direction of the retainer ring 3 (that is, fixes the position in the horizontal direction of the retainer ring 3) while receiving the force in the lateral direction (the force toward the outside in the radial direction of the wafer W), which is received by the retainer ring 3 from the wafer W due to the friction between the wafer W and the polishing pad 19 during polishing of the wafer W.

Figure 5:
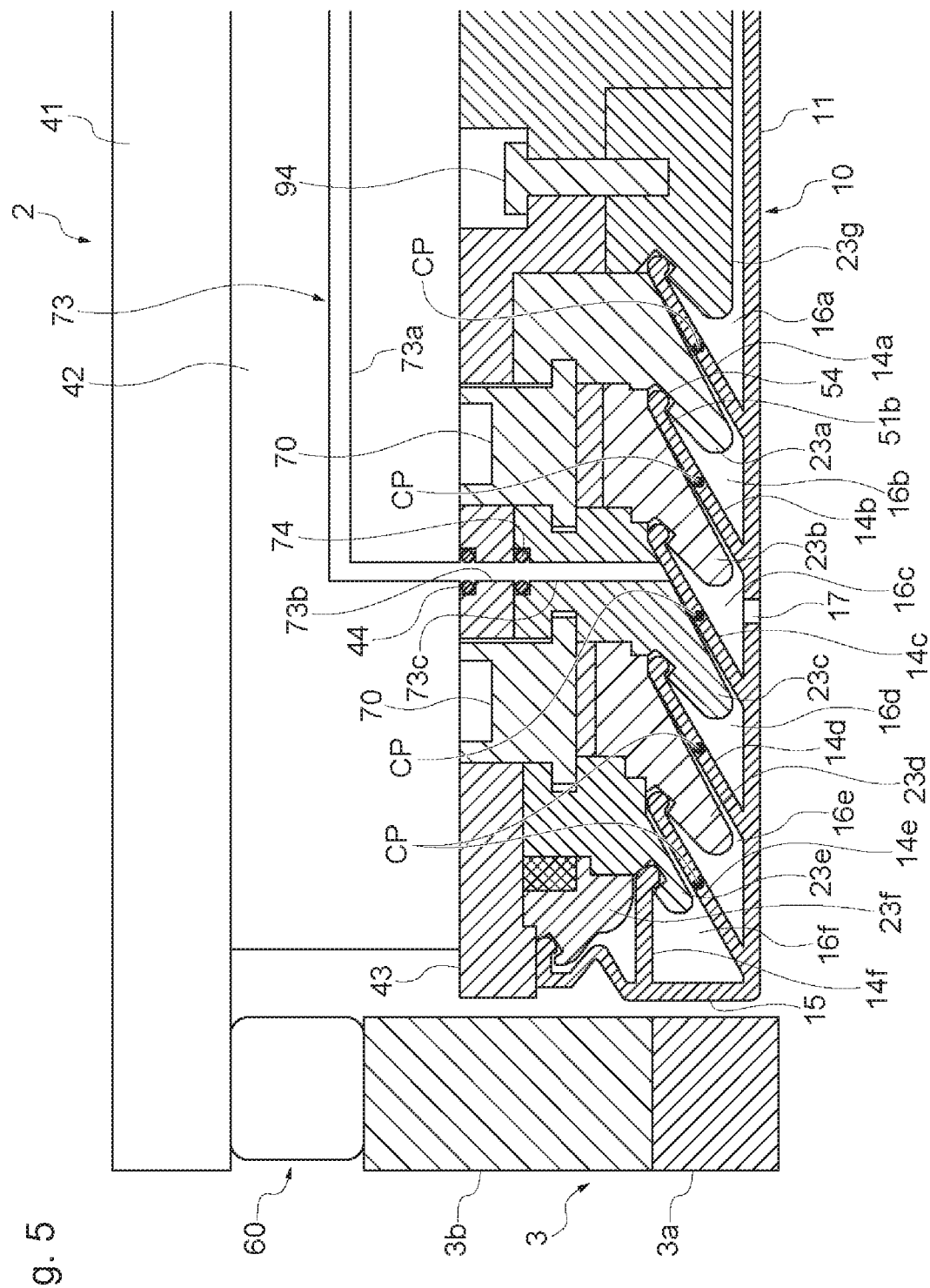
FIG. 5 is a schematic sectional view illustrating a state in which an elastic membrane according to the embodiment of the present invention is connected to a carrier of a head body.
Figure 6:
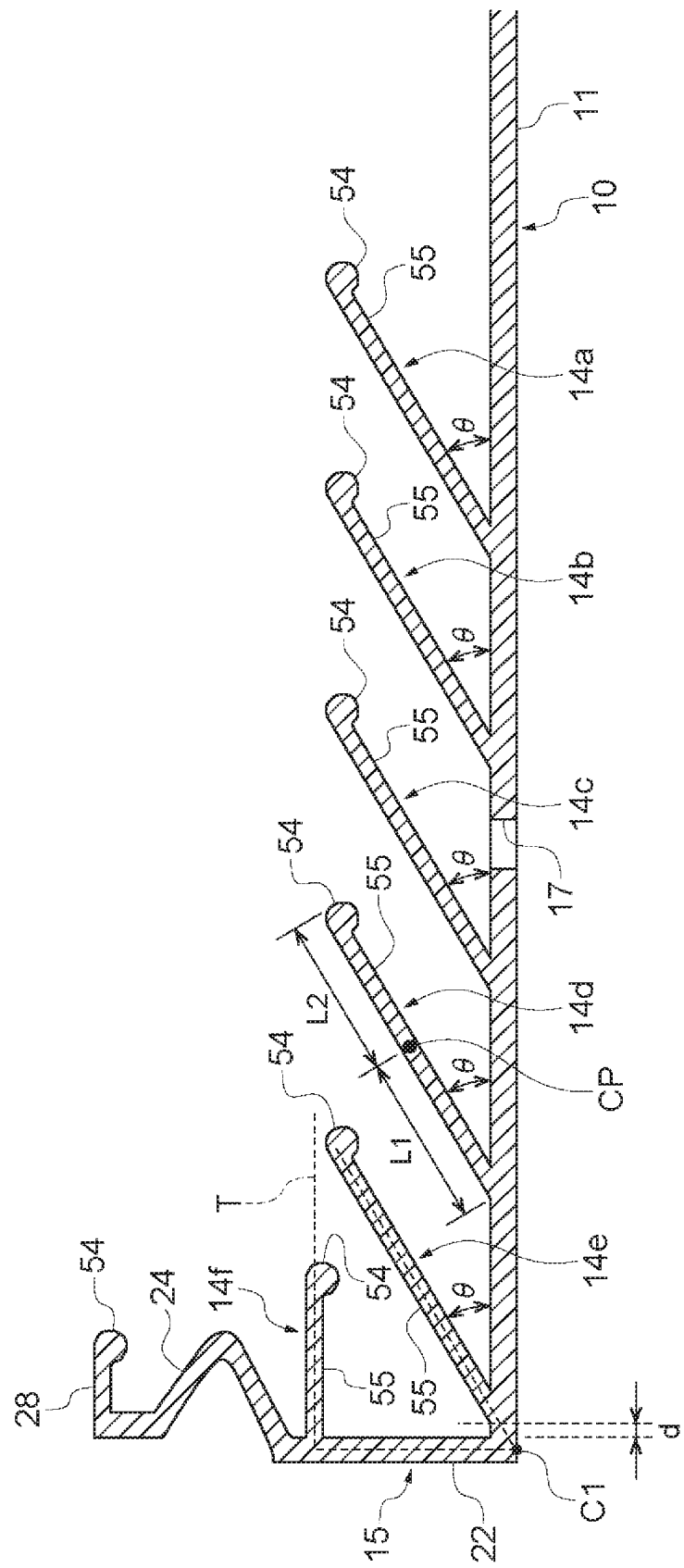
FIG. 6 is an enlarged sectional view illustrating a part of the elastic membrane illustrated in FIG. 5.

FIG. 5 is a schematic sectional view illustrating a state in which the elastic membrane 10 is connected to the head body 2, and FIG. 6 is an enlarged sectional view illustrating a part of the elastic membrane 10 illustrated in FIG. 5. The elastic membrane 10 includes the circular contact portion 11 as a contact surface coming into contact with the wafer W, the annular side wall 15 provided to vertically stand from the outer peripheral end of the contact portion 11, the plurality of (five in FIG. 5) partition walls 14a, 14b, 14c, 14d, and 14e connected to the upper surface of the contact portion 11, and the partition wall 14f connected to an inner surface of the side wall 15. The partition walls 14a to 14f are concentrically arranged annular partition walls.

As described above, the seven pressure chambers (that is, the central pressure chamber 16a, the intermediate pressure chambers 16b to 16e, and the edge pressure chambers 16f and 16g) are formed by the six partition walls 14a to 14f. The contact portion 11 comes in contact with a back surface of the wafer W, that is, a surface on the opposite side of a surface to be polished, and pushes the wafer W against the polishing pad 19.

The edge pressure chamber 16g and the edge pressure chamber 16f are partitioned by the roughly horizontally extending partition wall 14f. Since the partition wall 14f is connected to the side wall 15, a differential pressure between the edge pressure chamber 16g and the edge pressure chamber 16f generates a downward force pushing down the side wall 15 in the vertical direction. That is, when the pressure in the edge pressure chamber 16g is larger than the pressure in the edge pressure chamber 16f, the downward force is generated in the side wall 15 by the differential pressure between the edge pressure chambers 16g and 16f, and the side wall 15 pushes a peripheral edge portion of the contact portion 11 against the back surface of the wafer W in the vertical direction. As a result, the peripheral edge portion of the contact portion 11 pushes a wafer edge portion against the polishing pad 19. In this manner, since the downward force acts on the side wall 15 itself in the vertical direction, the peripheral edge portion of the contact portion 11 can push a narrow region of the edge portion of the wafer W against the polishing pad 19. Therefore, a profile of the edge portion of the wafer W can be precisely controlled.

In the following description, in the case where discrimination of the partition walls 14a to 14f is not necessary, and in the case of collectively referring the partition walls 14a to 14f, they are written as a partition wall 14. Further, as for the pressure chambers 16a to 16g, in the case of no discrimination is necessary and in the case of collectively referring the pressure chambers 16a to 16g, they are written as a pressure chamber 16.

In the partition walls 14a to 14e extending from the upper surface of the contact portion 11, the partition wall 14e is connected to the outer peripheral end portion of the contact portion 11, the partition wall 14d is arranged on an inner side of the partition wall 14e in the radial direction, the partition wall 14c is arranged on an inner side of the partition wall 14d in the radial direction, the partition wall 14b is arranged on an inner side of the partition wall 14c in the radial direction, and the partition wall 14a is arranged on an inner side of the partition wall 14b in the radial direction. In the following description, the partition wall 14f is referred to as a first partition wall 14f, the partition wall 14e is referred to as a second partition wall 14e, the partition wall 14d is referred to as a third partition wall 14d, the partition wall 14c is referred to as a fourth partition wall 14c, the partition wall 14b is referred to as a fifth partition wall 14b, and the partition wall 14a is referred to as a sixth partition wall 14a. The partition walls 14a to 14e extending from the upper surface of the contact portion 11 extend upward from the upper surface of the contact portion 11.

A plurality of continuous holes 17 communicating with the pressure chambers 16c formed between the fifth partition wall 14b and the fourth partition wall 14c is formed in the contact portion 11 at predetermined pitches in a peripheral direction. In FIGS. 5 and 6, only one continuous hole 17 is illustrated. When the intermediate pressure chamber 16c in which the plurality of continuous holes 17 is formed is depressurized in the state where the wafer W is in contact with the contact portion 11, the wafer W is held on the lower surface of the contact portion 11. That is, the wafer W is held by the polishing head 1 by vacuum suction. Further, when a fluid is supplied to the intermediate pressure chamber 16c in which the plurality of continuous holes 17 is formed in the state where the wafer W is separated from the polishing pad 19, the wafer W is released from the polishing head 1. The continuous hole 17 may be formed in another pressure chamber in place of the intermediate pressure chamber 16c. At that time, vacuum suction and release of the wafer W are performed by controlling the pressure in the pressure chamber in which the continuous hole 17 is formed.

In the present embodiment, the partition walls 14a to 14e extending from the upper surface of the contact portion 11 are constituted as inclined partition walls inclined inward in the radial direction, and all have a linear shape (straight shape). Hereinafter, as a representative of the partition walls 14a to 14e as the inclined partition walls, the constitution of the partition wall 14e located on the outermost side will be described.

The second partition wall 14e as the inclined partition wall linearly extends inward and upward in the radial direction in sectional view from the outer peripheral end portion of the contact portion 11. The second partition wall 14e is constituted by a partition wall body 55 linearly extending inward and upward in the radial direction from the upper surface of the contact portion 11, and an annular seal projection 54 formed on a distal end of the partition wall body 55. In the present embodiment, the seal projection 54 has a circular section shape, and the partition wall body 55 extends in a tangential direction of the seal projection 54.

The second partition wall 14e extends upward while inclined inward at a predetermined angle θ in the radial direction in an entire region from a lower end portion (proximal end portion) to an upper end portion. The lower end portion of the second partition wall 14e is connected to the contact portion 11, and the upper end portion (that is, the seal projection 54) of the second partition wall 14e is connected to a coupling ring 23d of the head body 2 described below.

The inclination angle θ of the partition wall 14e with respect to the bottom surface is favorably set in a range of 20° to 70°. If the inclination angle θ is smaller than 20°, when a pressure difference between the fluids supplied to adjacent pressure chambers 16 is large, adjacent partition walls 14 may come in contact with each other. If the inclination angle θ is larger than 70°, expansion and contraction of the elastic membrane 10 in the vertical direction (that is, deformation of the elastic membrane 10) may be hindered by the partition wall 14. In this case, the elastic membrane 10 cannot appropriately expand and contract in accordance with the pressure of the fluid supplied to the pressure chamber 16. Therefore, adjusting the pressing force to be applied to the wafer W on a region to region basis of the wafer W may become difficult.

As illustrated in FIG. 6, the partition walls 14a to 14e constituted as the inclined partition walls have the same shape as one another, and thus the partition walls 14a to 14e extend in parallel to one another. More specifically, the partition wall bodies 55 of the partition walls 14a to 14e are parallel to one another. As illustrated in FIG. 5, the pressure chamber 16b is formed between the sixth partition wall 14a and the fifth partition wall 14b, the pressure chamber 16c is formed between the fifth partition wall 14b and the fourth partition wall 14c, the pressure chamber 16d is formed between the fourth partition wall 14c and the third partition wall 14d, the pressure chamber 16e is formed between the third partition wall 14d and the second partition wall 14e, and the edge pressure chamber 16f is formed between the second partition wall 14e and the first partition wall 14f.

Further, in the elastic membrane 10 illustrated in FIGS. 5 and 6, the partition walls 14a to 14e constituted as the inclined partition walls extend in parallel to one another. That is, the inclination angles θ of the partition wall bodies 55 of the partition walls 14a to 14e are the same. In this case, the adjacent partition walls 14 can be arranged at extremely narrow intervals. Therefore, the width of the pressure chamber 16 in the radial direction can be extremely narrowed.

The partition walls 14a to 14e may extend substantially in parallel to one another as long as the partition walls 14a to 14e constituted as the inclined partition walls do not come in contact with one another. More specifically, the inclination angles θ of the partition wall bodies 55 of the partition walls 14a to 14e constituted as the inclined partition walls may differ from one another to some extent. In the present specification, the expression "substantially in parallel" means that, when the inclination angle of one of the partition walls 14 constituted as the inclined partition walls (for convenience of description, this inclination angle is referred to as a reference inclination angle θs) is employed as a reference, the inclination angle θ of another partition wall 14 constituted as the inclined partition wall falls within a range of ±10° with respect to the reference inclination angle θs (that is, θs−10≤θ≤θs+10). For example, when the inclination angle of the partition wall 14a is 45° and the inclination angle of the partition wall 14a is employed as the reference inclination angle θs, the inclination angles θ of the partition walls 14b to 14e fall within ranges of ±10° (that is, from 35° to) 55° with respect to the reference inclination angle θ' (=) 45° of the partition wall 14a.

In the present embodiment, the side wall 15 includes a vertical portion 22 vertically extending from the outer peripheral end of the contact portion 11, a horizontal portion 28 formed on an upper end, and a bent portion 24 formed between an upper end of the vertical portion 22 and an outer end portion of the horizontal portion 28 and bent inward in the radial direction in a protruding manner. In addition, a seal projection 54 is also formed on a distal end (inner end) of the horizontal portion 28, similarly to the partition walls 14a to 14f.

The first partition wall 14f horizontally extends inward in the radial direction from an upper end portion of the vertical portion 22 of the side wall 15. Similarly to the partition walls 14a to 14e, the partition wall 14f also has a straight shape as a whole and is constituted by a linearly extending partition wall body 55 and an annular seal projection 54 formed on a distal end of the partition wall body 55. Note that the partition wall body 55 of the partition wall 14f horizontally extends inward in the radial direction from the inner surface of the side wall 15.

Here, the edge pressure chamber 16f constituted by the first partition wall 14f, the vertical portion 22 of the side wall 15, and the second partition wall 14e will be further described. Both the first partition wall 14f and the second partition wall 14e have a linear shape (straight shape) in sectional view, and the partition wall bodies 55 have no bent portion or curved portion except the end portions. Further, the vertical portion 22 of the side wall 15 has a linear shape (straight shape) in sectional view, and the vertical portion 22 has no bent portion or curved portion. Therefore, a triangle T is formed in sectional view by an extended line of the first partition wall 14f, the vertical portion 22 of the side wall 15, and an extended line of the second partition wall 14e. The position in the radial direction of one vertex C1 of the triangle T is the outer peripheral end of the contact portion 11 of the elastic membrane 10.

In the edge pressure chamber 16f, the interval between the first partition wall 14f and the second partition wall 14e gradually increases from the inside to the outside in the radial direction of the contact portion 11. Further, in the vertical portion 22 of the side wall 15, that is, in at least the portion constituting the edge pressure chamber 16f, an outer peripheral surface has no step and is flat.

The second partition wall 14e, which is the outermost partition wall among the partition walls 14a to 14e formed on the upper surface of the contact portion 11, is connected to the outer peripheral end portion of the contact portion 11. In the present specification, the term "outer peripheral end portion" means a range including the outer peripheral end of the contact portion 11 and also including a portion slightly inside of the outer peripheral end. Specifically, in the case where a distance (edge pressing width) d between a point where an upper surface of the second partition wall 14e and the upper surface of the contact portion 11 intersect with each other, and a point where the inner surface of the side wall 15 and the upper surface of the contact portion 11 intersect with each other is 0 to 8 mm in sectional view as illustrated in FIG. 6, the second partition wall 14e is connected to the outer peripheral end portion of the contact portion 11 or extends from the outer peripheral end portion of the contact portion 11. Note that, in the present embodiment, the edge pressing width d is set to 0.5 to 1.5 mm.

Although the elastic membrane 10 cannot autonomously maintain the shape illustrated in FIGS. 5 and 6 by its elasticity, the shape of the elastic membrane 10 attached to the head body 2 and being in the state ready for use for polishing is referred when describing the shape of the elastic membrane 10 in the present embodiment.

The elastic membrane 10 including the partition walls 14a to 14f, the side wall 15, and the contact portion 11 can be integrally molded using a mold or the like.

As described above, a fluid is supplied to each of the pressure chambers 16a to 16f through the fluid line 73 (see FIGS. 1 and 2) extending from the pressure adjustment device 65 via the rotary joint 82. FIG. 5 illustrates only a part of the fluid line 73 for supplying the fluid from the pressure adjustment device 65 to the pressure chamber 16d.

The part of the fluid line 73 illustrated in FIG. 5 is constituted by a through hole 73a formed in the spacer 42, a through hole 73b formed in the carrier 43 and communicating with the through hole 73a, and a through hole 73c formed in a coupling ring 23 described below and communicating with the through hole 73b. These through holes 73a, 73b, and 73c have the same diameter. An annular recessed portion is formed in an upper end of the through hole 73c formed in the coupling ring 23, and a seal member (for example, an O-ring) 74 for sealing a gap between the coupling ring 23 and the carrier 43 is arranged in the recessed portion. The fluid flowing through the through holes 73b and 73c is prevented from leaking through the gap between the coupling ring 23 and the carrier 43 by the seal member 74.

Similarly, an annular recessed portion is formed in an upper end of the through hole 73b formed in the carrier 43, and a seal member (for example, an O-ring) 44 for sealing a gap between the carrier 43 and the spacer 42 is arranged in the recessed portion. The fluid flowing through the through holes 73a and 73b is prevented from leaking through the gap between the spacer 42 and the carrier 43 by the seal member 44.

The head body 2 further includes a plurality of coupling rings 23a to 23f to which the partition walls 14a to 14f and the side wall 15 are connected. The coupling ring 23a is arranged between the sixth partition wall 14a and the fifth partition wall 14b and is referred to as a sixth coupling ring 23a in the following description. The coupling ring 23b is arranged between the fifth partition wall 14b and the fourth partition wall 14c and is referred to as a fifth coupling ring 23b in the following description. The coupling ring 23c is arranged between the fourth partition wall 14c and the third partition wall 14d and is referred to as a fourth coupling ring 23c in the following description. The coupling ring 23d is arranged between the third partition wall 14d and the second partition wall 14e and is referred to as a third coupling ring 23d in the following description.

The coupling ring 23e is arranged between the second partition wall 14e and the first partition wall 14f and is referred to as a second coupling ring 23e in the following description. The coupling ring 23f is arranged between the first partition wall 14f, and the bent portion 24 and the horizontal portion 28 of the side wall 15, and is referred to as a first coupling ring 23f in the following description. In this way, each of the coupling rings 23a to 23e is arranged between the adjacent partition walls 14.

In the present embodiment, the sixth partition wall 14a is also constituted as the inclined partition wall, and thus the head body 2 includes a coupling ring 23g to which the partition wall 14a is connected. In the following description, the coupling ring 23g is referred to as an additional coupling ring 23g.

The sixth coupling ring 23a, the fifth coupling ring 23b, the fourth coupling ring 23c, the third coupling ring 23d, the second coupling ring 23e, and the first coupling ring 23f have similar constitutions. Hereinafter, a detailed structure will be described using the fourth coupling ring 23c as a representative example.

Figure 7A:
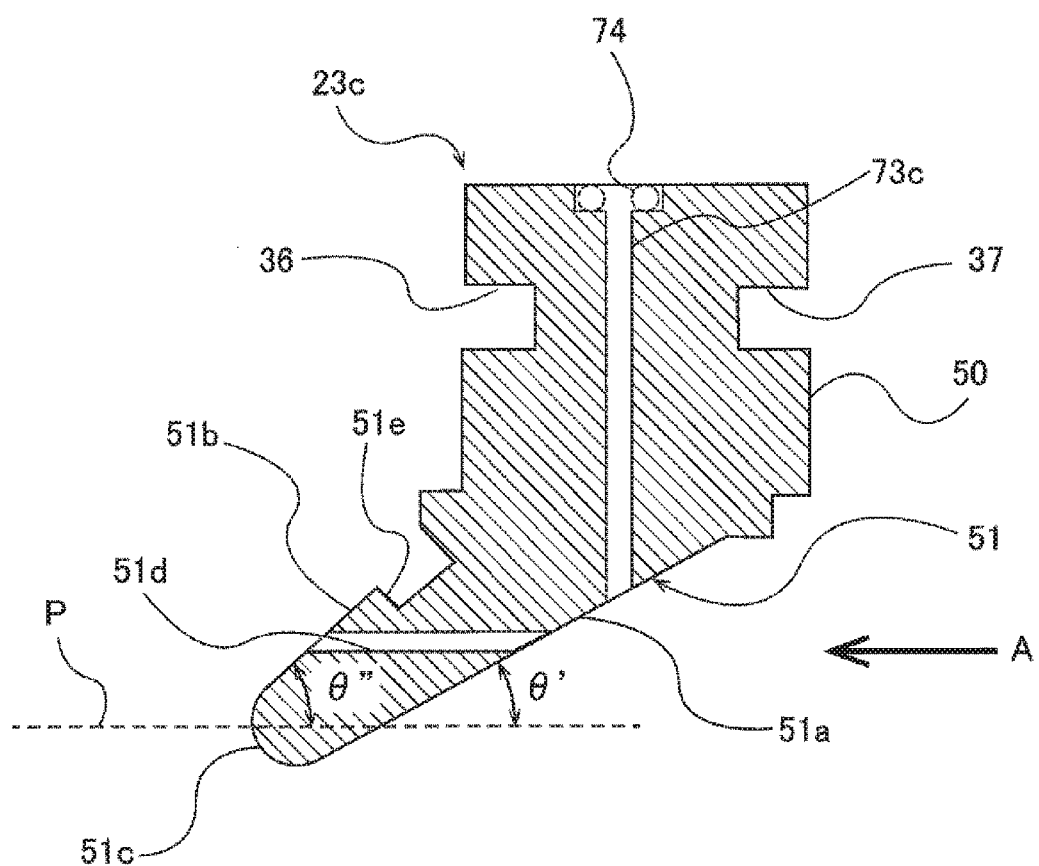
FIG. 7A is a sectional view of a third coupling ring according to the embodiment of the present invention.
Figure 7B:
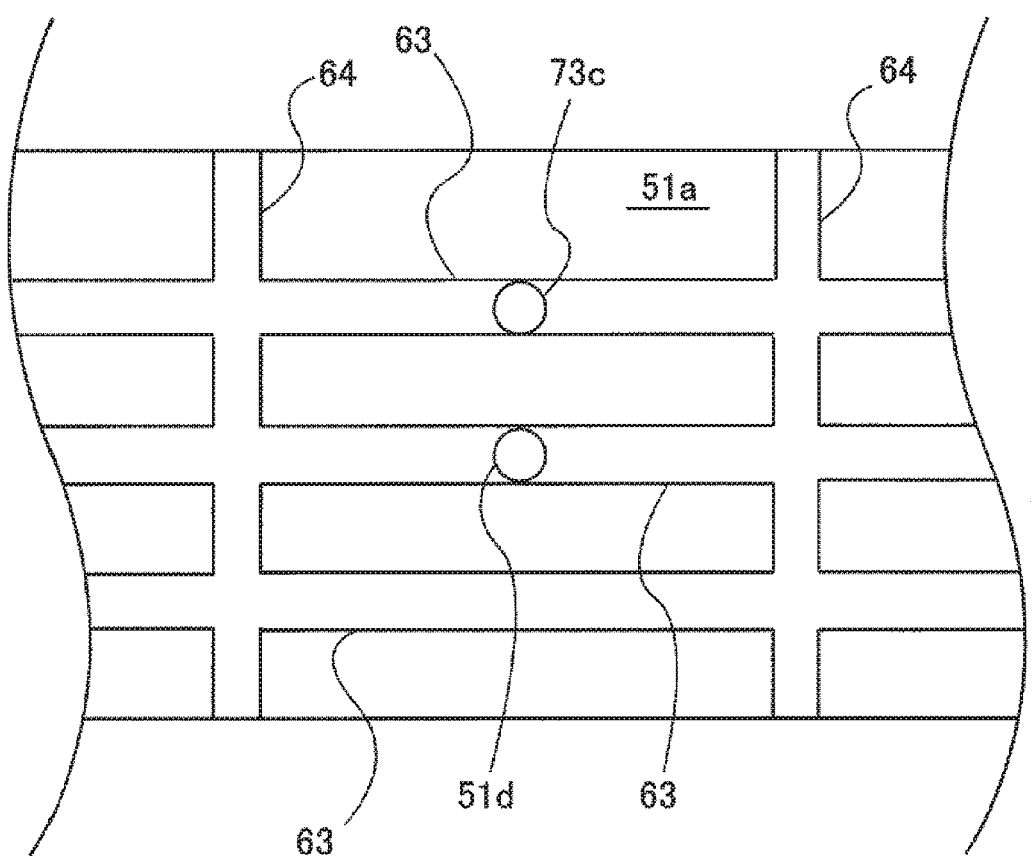
FIG. 7B is an arrow view taken along the line A of FIG. 7A.

FIG. 7A is a sectional view of the fourth coupling ring 23c, and FIG. 7B is an arrow view taken along the line A of FIG. 7A. In FIG. 7A, the seal member 74 is drawn with a virtual line (dotted line). The fourth coupling ring 23c includes a ring vertical portion 50 vertically extending to the carrier 43 of the head body 2, and a ring inclined portion 51 inclined downward while extending outward in the radial direction from the ring vertical portion 50. An inclination angle θ' of an inner peripheral surface 51a of the ring inclined portion 51 with respect to a horizontal plane P parallel to the contact portion 11 of the elastic membrane 10 is smaller than the inclination angle θ (see FIG. 6) of the fourth partition wall 14c constituted as the inclined partition wall, and an inclination angle θ" of an outer peripheral surface 51b of the ring inclined portion 51 with respect to the horizontal plane P is larger than the inclination angle θ of the second partition wall 14e constituted as the inclined partition wall.

The outer peripheral surface 51b of the ring inclined portion 51 is connected with the inner peripheral surface 51a of the ring inclined portion 51 at a distal end 51c of the ring inclined portion 51. Therefore, the ring inclined portion 51 has a section shape gradually narrowed toward the distal end 51c of the ring inclined portion 51. The distal end 51c of the ring inclined portion 51 at which the inner peripheral surface 51a and the outer peripheral surface 51b are connected has a section shape of a curved surface (for example, a semi-circular section shape). Further, the fourth coupling ring 23c includes a through hole 51d extending from the inner peripheral surface 51a to the outer peripheral surface 51b of the ring inclined portion 51 of the fourth coupling ring 23c. Furthermore, an annular seal groove 51e extending over the entire periphery of the outer peripheral surface 51b of the ring inclined portion 51 is formed in the outer peripheral surface 51b.

As illustrated in FIG. 7B, in the inner peripheral surface 51a of the ring inclined portion 51 of the fourth coupling ring 23c, a plurality of lateral grooves 63 extending in the peripheral direction of the inner peripheral surface 51a, and a plurality of longitudinal grooves 64 communicating the adjacent lateral grooves 63 with each other are formed. In the present embodiment, the through hole 73c of the fluid line 73 opens in the lateral groove 63 formed in the inner peripheral surface 51a of the ring inclined portion 51, and the through hole 51d opens in the lateral groove 63 different from the lateral groove 63 in which the fluid line 73 opens.

The through hole 73c of the fluid line 73 and the through hole 51d may respectively open in the longitudinal grooves 64 formed in the inner peripheral surface 51a of the ring inclined portion 51. Although not illustrated, in the outer peripheral surface 51b of the ring inclined portion 51 of the fourth coupling ring 23c, a plurality of lateral grooves extending in the peripheral direction of the outer peripheral surface 51b, and a plurality of longitudinal grooves communicating the adjacent lateral grooves with each other are formed. The through hole 51d favorably opens in the lateral groove or the longitudinal groove formed in the outer peripheral surface 51b of the ring inclined portion 51.

The seal projection 54 of the partition wall 14 illustrated in FIG. 6 is fit into the seal groove 51e formed in the outer peripheral surface 51b of the ring inclined portion 51. When the elastic membrane 10 is connected to the head body 2, the seal projection 54 is pressed against a bottom surface of the seal groove 51e by the inner peripheral surface 51a of the ring inclined portion 51 of the coupling ring 23 located on an outside of the seal projection 54 in the radial direction. For example, the seal projection 54 formed on the distal end of the fifth partition wall 14b is fit into the seal groove 51e formed in the outer peripheral surface 51b of the ring inclined portion 51 of the sixth coupling ring 23a, and is pressed against the bottom surface of the seal groove 51e of the sixth coupling ring 23a by the inner peripheral surface 51a of the ring inclined portion 51 of the fifth coupling ring 23b.

As a result, the gap between the fifth partition wall 14b and the ring inclined portion 51 of the sixth coupling ring 23a, and the gap between the fifth partition wall 14b and the outer peripheral surface 51b of the ring inclined portion 51 of the fifth coupling ring 23b are sealed. With such a constitution, the fluid supplied to each of the pressure chambers 16a to 16e is prevented from leaking from each of the pressure chambers 16a to 16e. As described above, the seal projection 54 of the partition wall 14 is engaged with the head body 2 to fix the partition wall 14 to the head body 2, thereby supporting the elastic membrane 10 on the head body 2, and corresponds to an engaging portion of the present invention. In particular, the seal projection 54 of the first partition wall f corresponds to a first engaging portion of the present invention and the seal projection 54 of the second partition wall 14e corresponds to a second engaging portion of the present invention.

Figure 8:
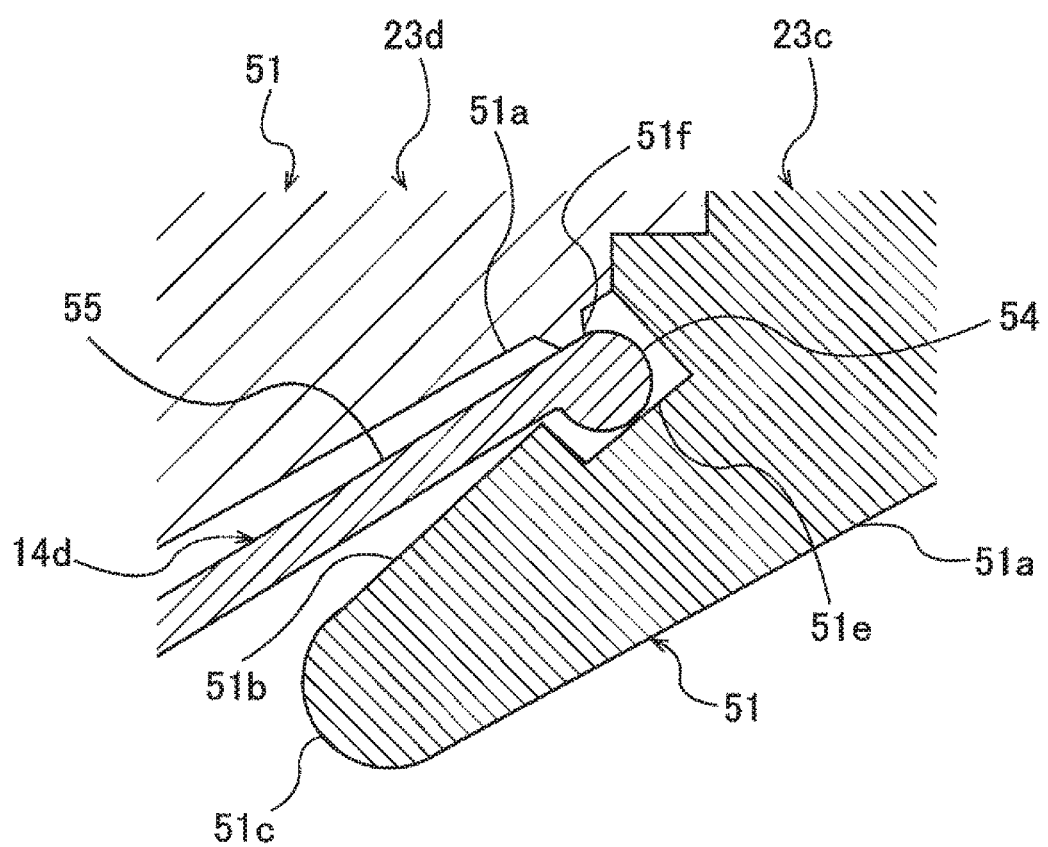
FIG. 8 is an enlarged sectional view illustrating an example in which a pressing projection is formed on an inner peripheral surface of a ring inclined portion of the coupling ring according to the embodiment of the present invention.

As illustrated in FIG. 8, an annular pressing projection 51f facing the seal projection 54 fit in the seal groove 51e may be formed on the inner peripheral surface 51a of the ring inclined portion 51 of the coupling ring 23. The pressing projection 51f extends over the entire periphery of the inner peripheral surface 51a of the ring inclined portion 51. The seal projection 54 can be pressed against the bottom surface of the seal groove 51e with a stronger pressing force by the pressing projection 51f. As a result, the fluid supplied to each of the pressure chambers 16a to 16e can be more effectively prevented from leaking from each of the pressure chambers 16a to 16e.

As illustrated in FIG. 5, the partition walls 14a to 14f are respectively in contact with the coupling rings 23a to 23f only with the seal projections 54. That is, a gap is formed between the ring inclined portion 51 having a section shape gradually narrowed toward the distal end 51c and the partition wall 14 except the seal projection 54. With the gap, when a pressurized fluid is supplied to each of the pressure chambers 16a to 16f, the partition walls 14a to 14f are allowed to move in the radial direction (that is, allowed to rotate having the seal projection 54 as a fulcrum). As a result, the elastic membrane 10 can be smoothly expanded in accordance with the pressure of the fluid supplied to each of the pressure chambers 16a to 16f, and therefore the polishing profile can be precisely adjusted.

As described above, when the pressurized fluid is supplied to each of the pressure chambers 16a to 16f, the elastic membrane 10 is expanded, and connection portions between the partition walls 14a to 14e and the contact portion 11 also move in the radial direction. However, in the portions of the partition walls 14a to 14e other than the seal projections 54, the above-described gaps are formed between the partition walls 14a to 14e and the coupling rings 23a to 23e. Therefore, the movement of the partition walls 14a to 14e to some extent in the radial direction is not disturbed by the coupling rings 23a to 23f. Therefore, the elastic membrane 10 can be expanded in accordance with the pressure of the fluid supplied to each of the pressure chambers 16a to 16f.

When there is a pressure difference between the fluids respectively supplied to the adjacent pressure chambers 16, the partition walls partitioning the pressure chambers 16 try to deform in the radial direction. However, the radial deformation of the partition wall 14 is restricted by the inner peripheral surface 51a or the outer peripheral surface 51b of the ring inclined portion 51 of the coupling ring 23. Therefore, the partition wall 14 is effectively prevented from coming in contact with the upper surface of the contact portion 11, and the adjacent partition walls 14 are effectively prevented from coming in contact with each other at the same time. In the present embodiment, the distal end 51c of the ring inclined portion 51 of the coupling ring 23 has a section shape of a curved surface. Therefore, damage to the partition wall 14 can be prevented even when the partition wall 14 comes in contact with the distal end 51c of the ring inclined portion 51.

As described above, the coupling ring 23 includes the lateral groove 63 and the longitudinal groove 64 formed in the inner peripheral surface 51a and the outer peripheral surface 51b of the ring inclined portion 51, and the through hole 51d extending from the inner peripheral surface 51a to the outer peripheral surface 51b and opening in the lateral groove 63 (or the longitudinal groove 64). Further, the through hole 73c (see FIG. 5) of the fluid line 73 through which the fluid supplied to each of the pressure chambers 16a to 16f flows opens in the lateral groove 63.

Therefore, even if the partition wall 14 comes in contact with the inner peripheral surface 51a and/or the outer peripheral surface 51b of the ring inclined portion 51 of the coupling ring 23 due to the pressure difference between the fluids respectively supplied to the adjacent pressure chambers 16, the fluid flowing through the fluid line 73 can be quickly and smoothly supplied to the pressure chamber 16 through the lateral groove 63, the longitudinal groove 64, and the through hole 51d formed in the ring inclined portion 51. As a result, even in a state where the partition wall 14 is in contact with the inner peripheral surface 51a and/or the outer peripheral surface 51b of the ring inclined portion 51 of the coupling ring 23, the pressure of the fluid supplied from the fluid line 73 can be promptly brought to act on the contact portion 11.

As illustrated in FIG. 5, the distal end 51c of the ring inclined portion 51 is favorably located lower than an intermediate point CP of each of the partition walls 14a to 14e constituted as the inclined partition walls. As illustrated in FIG. 6, the intermediate point CP is located at the center of each of the partition walls 14a to 14e extending upward at the predetermined inclination angle θ. That is, a distance L1 between the intermediate point CP of each of the partition walls 14a to 14e and the upper surface of the contact portion 11 is equal to a distance L2 between the intermediate point CP and the distal end of each of the partition walls 14a to 14e.

When vacuum is formed in the pressure chamber (for example, the intermediate pressure chamber 16c) in order to attract the wafer W to the substrate holding surface 10a (the lower surface of the contact portion 11) of the elastic membrane 10, the elastic membrane 10 deforms toward the head body 2. When the amount of deformation of the elastic membrane 10 is large, stress generated in the wafer W increases, and an electronic circuit formed on the wafer W may be damaged or the wafer W may be cracked. In this embodiment, since the distal end 51c of the ring inclined portion 51 is located lower than the intermediate point CP of each of the partition walls 14a to 14e, the distance between the upper surface of the contact portion 11 and the distal end 51c of the ring inclined portion 51 is short.

Therefore, when the wafer W is attracted to the substrate holding surface 10a (see FIG. 2) of the elastic membrane 10, the elastic membrane 10 comes in contact with the distal end 51c of the ring inclined portion 51, and the amount of deformation of the elastic membrane 10 can be reduced. As a result, the stress generated in the wafer W can be reduced. Further, since the distal end 51c of the ring inclined portion 51 has a section shape of a curved surface, damage to the elastic membrane 10 can be prevented when the elastic membrane 10 comes in contact with the distal end 51c of the ring inclined portion 51.

According to the present embodiment, the partition walls 14a to 14e are formed as the straight partition walls having no horizontal portion, which is formed in the conventional partition wall. Furthermore, these partition walls 14a to 14e have the same shape and extend in parallel (or substantially in parallel) to one another. Therefore, even when the pressure difference between the fluids supplied to the adjacent pressure chambers is large, the partition walls 14a to 14e do not come in contact with the upper surface of the contact portion 11.

Furthermore, adjacent partition walls can be prevented from coming in contact with each other. In particular, since the coupling ring 23 including the ring inclined portion 51 for restricting inward or outward movement in the radial direction of the partition wall 14 is provided between the adjacent partition walls 14, the contact between the partition wall 14 and the upper surface of the contact portion 11 and the contact between the adjacent partition walls 14 can be effectively prevented. As a result, the polishing profile of the wafer W held by the polishing head (substrate holding device) 1 can be precisely adjusted.

Further, according to the present embodiment, since the partition walls 14a to 14e constituted as the inclined partition walls extend in parallel to one another, the interval between the adjacent partition walls 14a to 14e can made small. As a result, the width in the radial direction of each of the pressure chambers 16a to 16e can be made small. Therefore, the polishing profile of the wafer W held by the polishing head (substrate holding device) 1 can be precisely adjusted.

When the partition walls 14a to 14e are formed as the inclined partition walls, the interval between adjacent partition walls 14 and the interval between the partition wall 14e and the vertical portion 22 of the side wall 15, and the width in the radial direction of each pressure chamber can be arbitrarily set according to the polishing profile of the wafer W. That is, the interval between adjacent partition walls 14 can be set to a desired interval (for example, an extremely narrow interval). At least two adjacent partition walls among the plurality of partition walls 14a to 14e may be constituted as the inclined partition walls. For example, the partition wall 14c, the partition wall 14d, and the partition wall 14e may be constituted as the inclined partition walls, or the two partition walls 14d and 14e arranged adjacent to the side wall 15 may be constituted as the inclined partition walls.

The coupling ring 23 is fixed to the carrier 43 with a plurality of fixtures. By fixing the coupling ring 23 to the carrier 43 with a fixing nail, the elastic membrane 10 is connected to the head body 2. In the case of connecting the elastic membrane 10 in which the interval between the adjacent partition walls 14 constituted as the inclined partition walls is small to the head body 2, the width in the radial direction of the coupling ring 23 of the head body 2 becomes also small. As a result, the fixtures for fixing the coupling ring 23 to the carrier 43 need to be arranged in a narrow space. Further, if the number of fixtures for fixing the coupling ring 23 to the carrier 43 is large, the work amount of attaching/detaching the elastic membrane 10 to/from the carrier 43 increases at the time of maintenance.

Further, there is a restriction on the space for installing the fixtures for fixing the coupling ring 23 to the carrier 43 of the head body 2. More specifically, the plurality of fluid lines 73 (see FIG. 2) through which the fluids are supplied to the respective pressure chambers 16a to 16f pass through the carrier 43 of the head body 2, and the fixtures need to be arranged not to interfere with these fluid lines 73. Further, the plurality of radial grooves 43a (see FIG. 3) in which the spokes 78 are accommodated is formed in the carrier 43 of the head body 2, and the fixtures cannot be arranged in positions where these grooves 43a are formed.

Therefore, in the present embodiment, the polishing head 1 includes a fixture 70 for simultaneously fixing two adjacent partition walls 14 formed as the inclined partition walls to the head body 2 via three or four coupling rings 23. Hereinafter, the fixture 70, and a method of fixing the coupling rings 23 to which the elastic membrane 10 is connected to the head body 2, using the fixture 70, will be described.

Figure 9A:
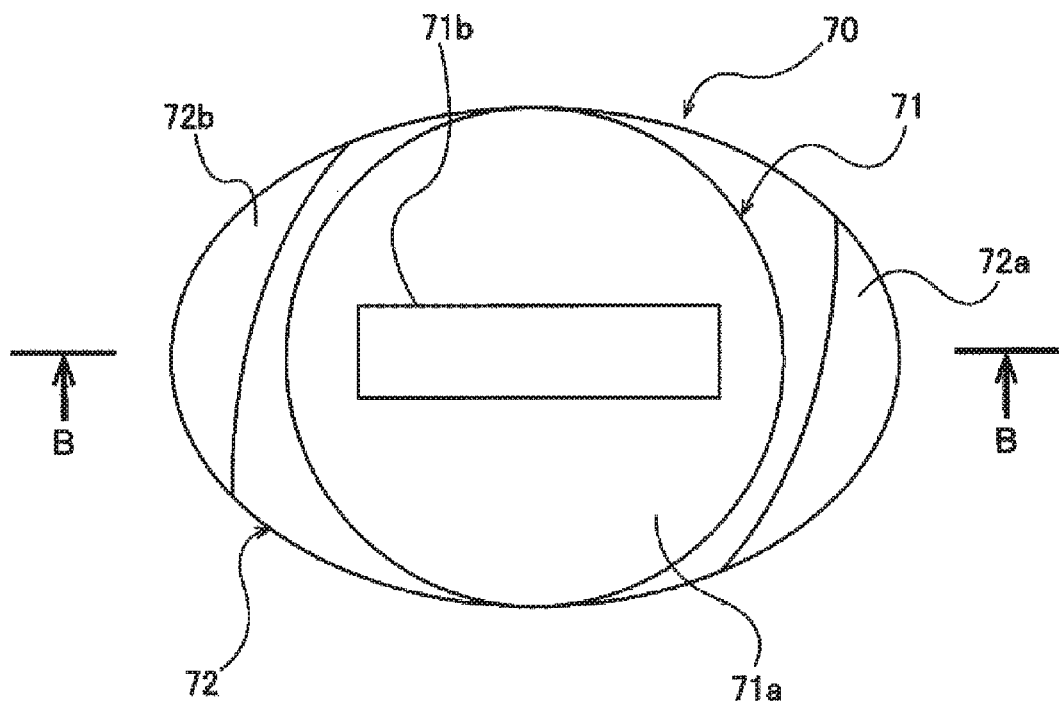
FIG. 9A is a top view of a fixture according to the embodiment of the present invention.
Figure 9B:
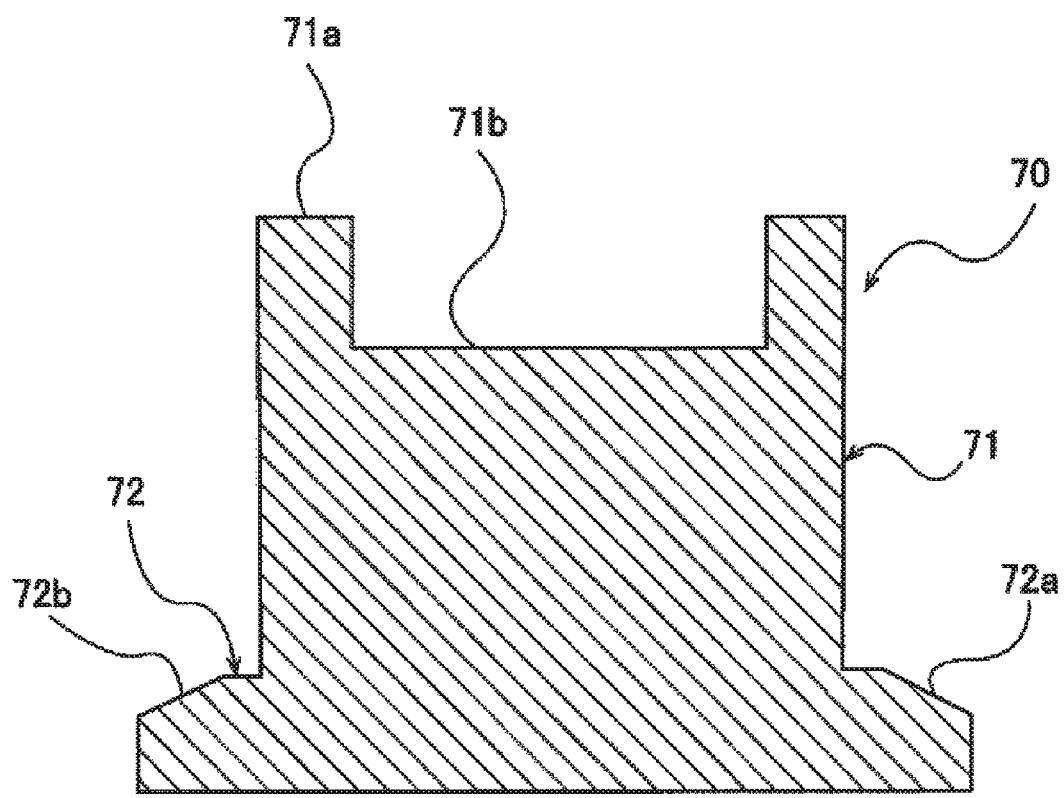
FIG. 9B is a sectional view taken along the line B-B of FIG. 9A.

FIG. 9A is a top view of the fixture 70, and FIG. 9B is a sectional view taken along the line B-B of FIG. 9A. As illustrated in FIGS. 9A and 9B, the fixture 70 includes a columnar fixture body 71 and a flange 72 protruding outward from an outer peripheral surface of the fixture body 71 and having an elliptical shape. The flange 72 includes two inclined surfaces 72a and 72b, and these inclined surfaces 72a and 72b extend to an outer peripheral surface of the flange 72. The thickness in the vertical direction of the flange 72 except the inclined surfaces 72a and 72b is the same as an engagement groove (described below) formed in the ring vertical portion 50 of the coupling ring 23. A groove 71b with which a distal end of a jig (not illustrated) (for example, a flat-blade screwdriver) is engageable is formed in an upper surface 71a of the fixture body 71. By bringing the distal end of the jig engaged with the groove 71b and further rotating the jig, the fixture 70 can be rotated.

Next, a method of simultaneously fixing three or four coupling rings 23 to the carrier 43 of the head body 2, using the fixture 70 illustrated in FIGS. 9A and 9B, will be described. When three coupling rings 23 are fixed to the carrier 43, two adjacent partition walls 14 are simultaneously connected to the head body 2. In the following description, the coupling ring 23 located on the inner side in the radial direction, of the three coupling rings 23, may be referred to as an inner coupling ring 23, the coupling ring 23 located on the outer side in the radial direction, of the three coupling rings 23, may be referred to as an outer coupling ring 23, and the coupling ring 23 located between the inner coupling ring 23 and the outer coupling ring 23 may be referred to as an intermediate coupling ring. Further, the partition wall 14 located on the inner side in the radial direction, between the two adjacent partition walls 14 constituted as the inclined partition walls, may be referred to as an inner partition wall 14, and the partition wall 14 located on the outer side in the radial direction, between the two adjacent partition walls 14 constituted as the inclined partition walls, may be referred to as an outer partition wall 14.

FIGS. 10 to 13 are schematic views illustrating processes of simultaneously fixing the three or four coupling rings 23 to the carrier 43, using the fixture 70 illustrated in FIGS. 9A and 9B, in order to connect the elastic membrane 10 illustrated in FIG. 6 to the head body 2.

In the elastic membrane 10 illustrated in FIG. 5, the fifth partition wall 14b is the inner partition wall 14, and the fourth partition wall 14c is the outer partition wall 14. The sixth coupling ring 23a is the inner coupling ring 23, the fifth coupling ring 23b is the intermediate coupling ring 23, and the fourth coupling ring 23c is the outer coupling ring 23, with respect to the fifth partition wall 14b and the fourth partition wall 14c. By fixing the coupling rings 23a to 23c to the carrier 43 with the fixture 70, the fifth partition wall 14b and the fourth partition wall 14c are connected to the head body 2.

Similarly, the third partition wall 14d is the inner partition wall 14 and the second partition wall 14e is the outer partition wall 14. The fourth coupling ring 23c is the inner coupling ring 23, the third coupling ring 23d is the intermediate coupling ring 23, and the second coupling ring 23e is the outer coupling ring 23, with respect to the third partition wall 14d and the second partition wall 14e. By fixing the coupling rings 23c to 23e to the carrier 43 with the fixture 70, the third partition wall 14d and the second partition wall 14e are connected to the head body 2. In this way, the fourth coupling ring 23c is the outer coupling ring 23 with respect to the fifth partition wall 14b and the fourth partition wall 14c, and is the inner coupling ring 23 with respect to the third partition wall 14d and the second partition wall 14e.

Figure 10:
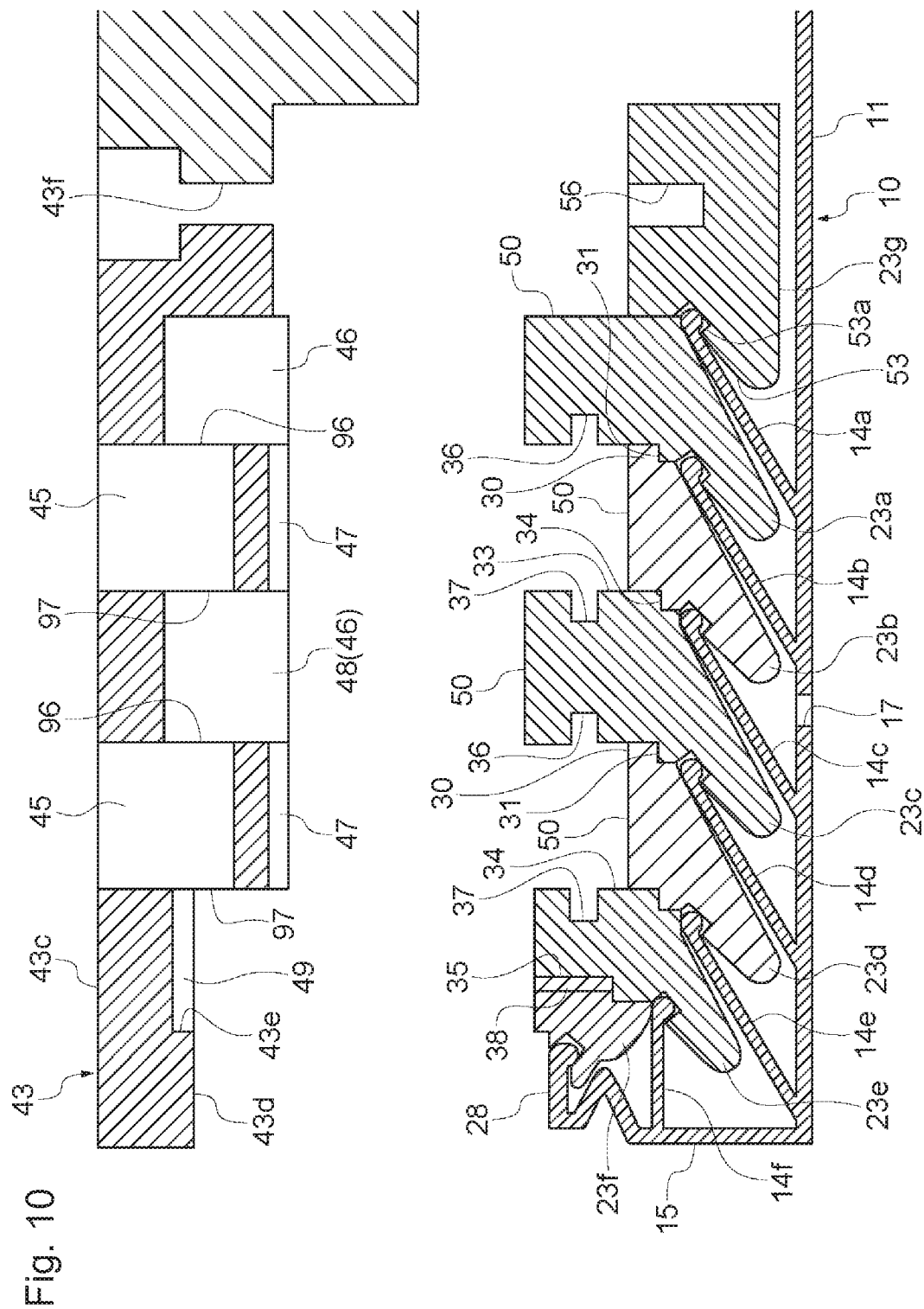
FIG. 10 is a schematic view illustrating a process of connecting the elastic membrane illustrated in FIG. 6 to the head body.

As illustrated in FIG. 10, a plurality of first recessed portions 45 into which the plurality of fixtures 70 is to be respectively inserted is formed in an upper surface 43c of the carrier 43 of the head body 2. Each of the first recessed portions 45 extends from the upper surface 43c of the carrier 43 toward a lower surface 43d of the carrier 43. The first recessed portion 45 has an elliptical cross section so that the flange 72 of the fixture 70 inserted into the first recessed portion 45 does not come in contact with the first recessed portion 45.

Further, an annular third recessed portion 47 into which the ring vertical portion 50 of the intermediate coupling ring 23 is to be inserted, a second recessed portion 46 and a fourth recessed portion 48 into which the ring vertical portion 50 of the outer coupling ring 23 is to be inserted, and a fifth recessed portion 49 into which the vertical portions 50 of the first coupling ring 23f and the second coupling ring 23e are to be inserted are formed in the lower surface 43d of the carrier 43. The second recessed portion 46, the third recessed portion 47, the fourth recessed portion 48, and the fifth recessed portion 49 extend over the entire periphery of the carrier 43 and extend from the lower surface 43d toward the upper surface 43c of the carrier 43.

An inner opening 96 is formed in an inner surface on the inner side in the radial direction of the first recessed portion 45, and an outer opening 97 is formed in an inner surface on the outer side in the radial direction of the first recessed portion 45. The first recessed portion 45 communicates with the second recessed portion 46 via the inner opening 96 and communicates with the fourth recessed portion 48 via the outer opening 97. When the fixture 70 inserted into the first recessed portion 45 is rotated, the flange 72 of the fixture 70 protrudes into interiors of the second recessed portion 46 and the fourth recessed portion 48 through the inner opening 96 and the outer opening 97.

The intermediate coupling ring 23 is sandwiched by the inner coupling ring 23 and the outer coupling ring 23, thereby to be held by the inner coupling ring 23 and the outer coupling ring 23. For example, the fifth coupling ring 23b as the intermediate coupling ring 23 is held by the sixth coupling ring 23a as the inner coupling ring 23 and the fourth coupling ring 23c as the outer coupling ring 23. Similarly, the third coupling ring 23d as the intermediate coupling ring 23 is held by the fourth coupling ring 23c as the inner coupling ring 23 and the second coupling ring 23e as the outer coupling ring 23.

In the present embodiment, the intermediate coupling ring 23 includes an annular protruding portion 30 protruding inward from an inner peripheral surface of the intermediate coupling ring 23, and the inner coupling ring 23 includes an annular stepped portion 31 on which the protruding portion 30 is placed. Further, the outer coupling ring 23 includes an annular protruding portion 33 protruding inward from an inner peripheral surface of the outer coupling ring 23, and the intermediate coupling ring 23 includes an annular stepped portion 34 on which the protruding portion 33 is placed. Since the fourth coupling ring 23c functions as the outer coupling ring 23 with respect to the fifth partition wall 14b and the fourth partition wall 14c and functions as the inner coupling ring 23 with respect to the third partition wall 14d and the second partition wall 14e, the fourth coupling ring 23c includes the annular protruding portion 33 and the annular stepped portion 31.

Further, an inner engagement groove 36 with which the flange 72 of the fixture 70 is engageable is formed in the ring vertical portion 50 of the inner coupling ring 23, and an outer engagement groove 37 with which the flange 72 of the fixture 70 is engageable is formed in the ring vertical portion 50 of the outer coupling ring 23. Since the fourth coupling ring 23c functions as the outer coupling ring 23 with respect to the fifth partition wall 14b and the fourth partition wall 14c and functions as the inner coupling ring 23 with respect to the third partition wall 14d and the second partition wall 14e, the fourth coupling ring 23c includes the inner engagement groove 36 and the outer engagement groove 37.

The seal projection 54 formed on the distal end of the inner partition wall 14 (for example, the fifth partition wall 14b) is fit into the seal groove 51e formed in the outer peripheral surface of the ring inclined portion 51 of the inner coupling ring 23 (for example, the sixth coupling ring 23a). The seal projection 54 formed on the distal end of the outer partition wall 14 (for example, the fourth partition wall 14c) is fit into the seal groove 51e formed in the outer peripheral surface of the ring inclined portion 51 of the intermediate coupling ring 23 (for example, the fifth coupling ring 23b). Further, the protruding portion 33 of the intermediate coupling ring 23 is placed on the stepped portion 34 of the intermediate coupling ring 23. This state is illustrated in FIG. 10.

Further, as illustrated in FIG. 10, the sixth partition wall 14a of the elastic membrane 10 is also constituted as the inclined partition wall. The sixth partition wall 14a is connected to the additional coupling ring 23g and is connected to the head body 2 by fixing the additional coupling ring 23g to the carrier 43. More specifically, the additional coupling ring 23g includes an inclined surface 53, and a seal groove 53a into which the seal projection 54 formed on the distal end of the sixth partition wall 14a is to be fit is formed in the inclined surface 53. The sixth partition wall 14a is sandwiched by the sixth coupling ring 23a and the additional coupling ring 23g in the state where the seal projection 54 of the sixth partition wall 14a is fit in the seal groove 53a of the additional coupling ring 23g, thereby to be held by the sixth coupling ring 23a and the additional coupling ring 23g.

Further, as illustrated in FIG. 10, the coupling ring 23f includes an annular protruding portion 35 protruding inward from an inner peripheral surface of the coupling ring 23, and the coupling ring 23e includes an annular stepped portion 38 on which the protruding portion 35 is placed. The side wall 15 of the elastic membrane 10 has the horizontal portion 28. The seal projection 54 is formed on the distal end of the horizontal portion 28, and the seal groove 51e into which the seal projection 54 is to be fit is formed in the outer peripheral surface of the first coupling ring 23f. When connecting the elastic membrane 10 to the carrier 43 of the head body 2, the partition walls 14b to 14e and the side wall of the elastic membrane 10 are held in advance by the coupling rings 23a to 23f, and the partition wall 14a is held in advance by the additional coupling ring 23g.

Figure 11:
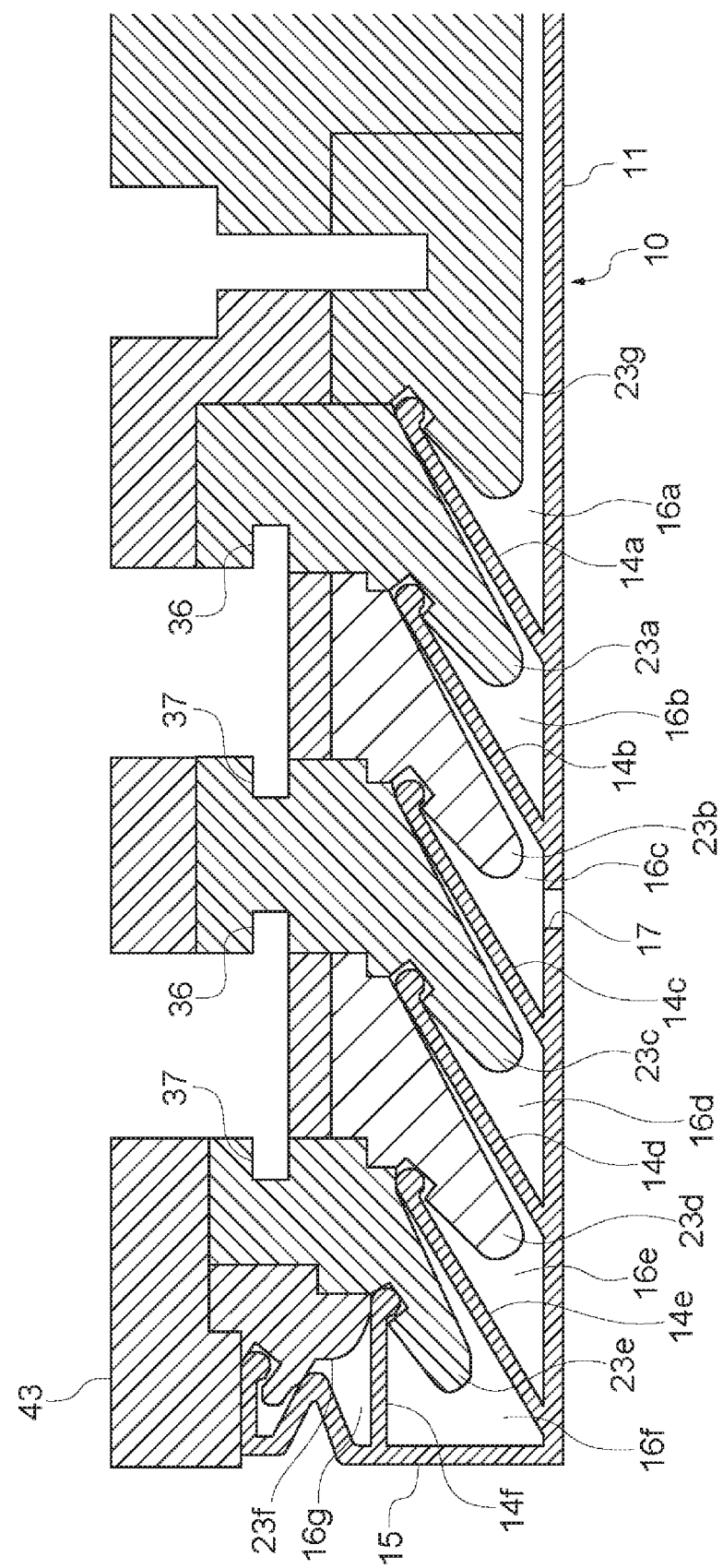
FIG. 11 is a schematic view illustrating a process of connecting the elastic membrane illustrated in FIG. 6 to the head body.
Figure 12:
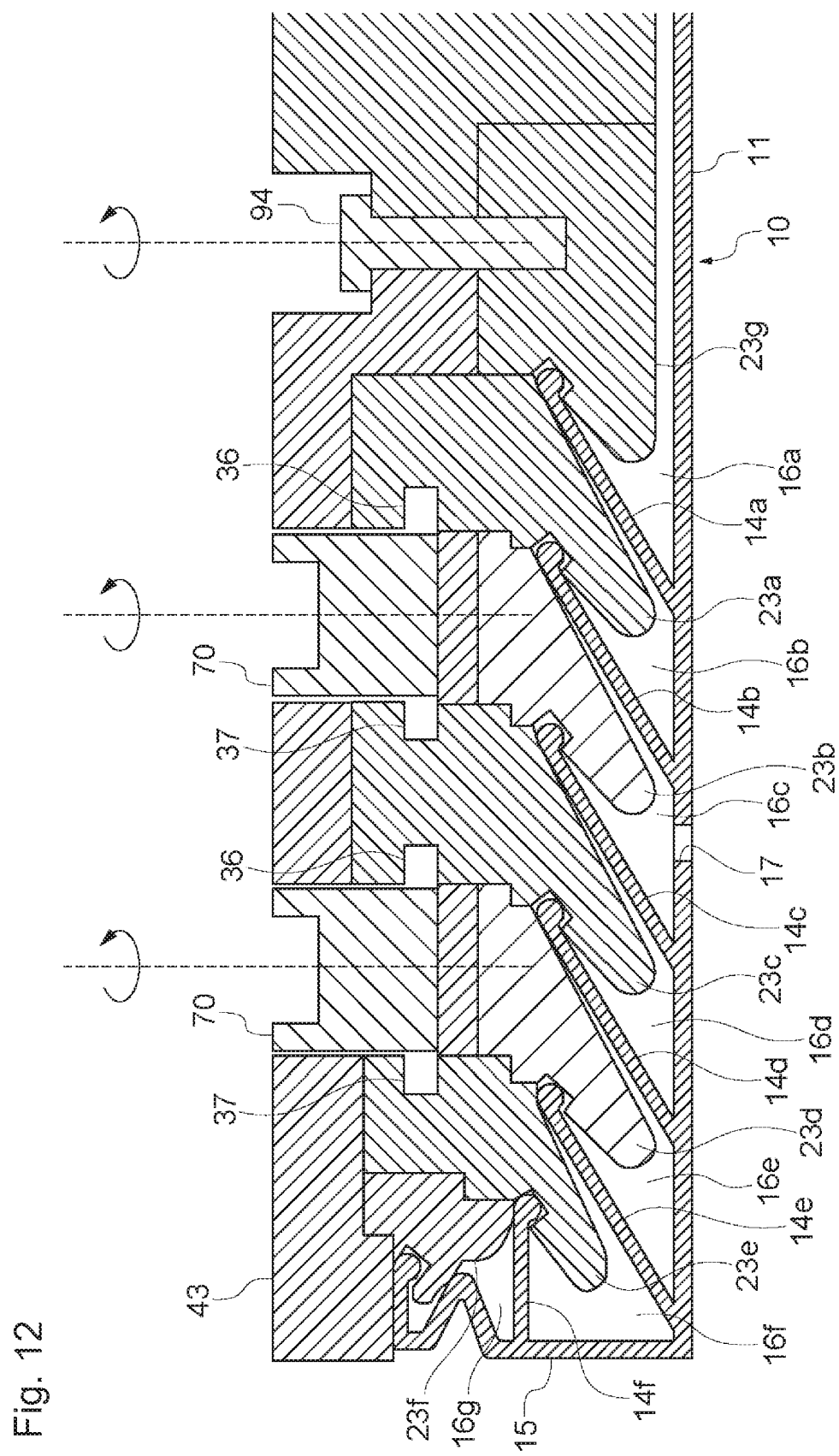
FIG. 12 is a schematic view illustrating a process of connecting the elastic membrane illustrated in FIG. 6 to the head body.
Figure 13:
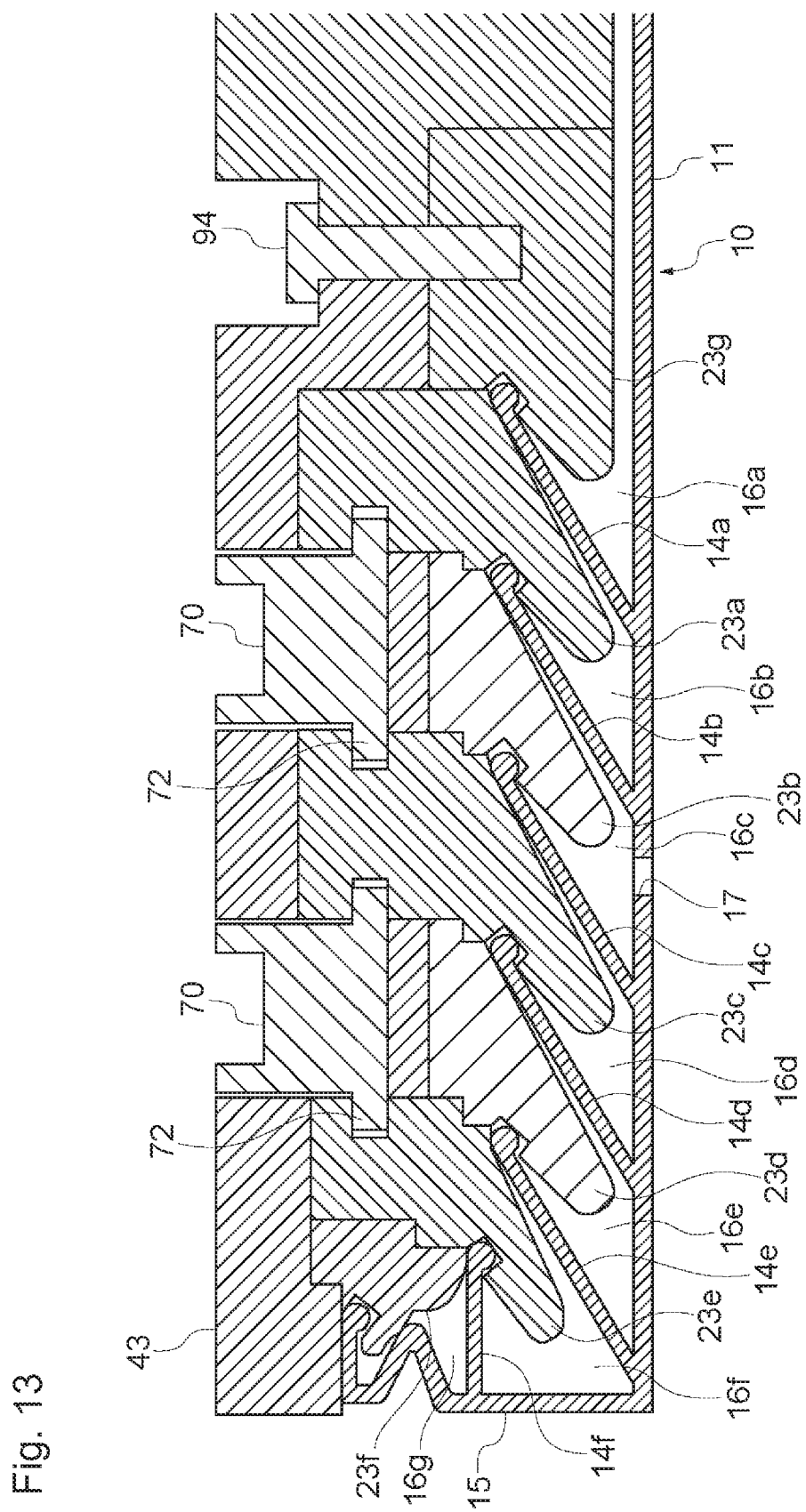
FIG. 13 is a schematic view illustrating a process of connecting the elastic membrane illustrated in FIG. 6 to the head body.

Next, as illustrated in FIG. 11, the elastic membrane 10, the coupling rings 23a to 23f, and the additional coupling ring 23g are moved toward the carrier 43, and the coupling rings 23a to 23f are inserted into the recessed portions 46, 47, 48, and 49 formed in the lower surface 43b of the carrier 43 (see FIG. 10). As illustrated in FIG. 10, the recessed portion into which the fourth coupling ring 23c is to be inserted is the fourth recessed portion 48 with respect to the fifth partition wall 14b and the fourth partition wall 14c, whereas the recessed portion is the second recessed portion 46 with respect to the third partition wall 14d and the second partition wall 14e.

As illustrated in FIGS. 9A and 9B, the two inclined surfaces 72a and 72b are formed in the flange 72 of the fixture 70. The inclined surfaces 72a and 72b extend to the outer peripheral surface of the flange 72. With the inclined surfaces 72a and 72b, the flange 72 can smoothly enter the engagement grooves 36 and 37.

Since the thickness of the flange 72 except the inclined surfaces 72a and 72b is the same as the thickness of the engagement grooves 36 and 37, the flange 72 having smoothly entered the engagement grooves 36 and 37 is firmly engaged with the engagement grooves 36 and 37. As a result, the inner coupling ring (for example, the sixth coupling ring 23a) and the outer coupling ring (for example, the fourth coupling ring 23c) are firmly fixed to the carrier 43. At this time, the intermediate coupling ring 23 (for example, the fifth coupling ring 23b) held by the inner coupling ring 23 and the outer coupling ring 23 is also firmly connected to the inner coupling ring 23 and the outer coupling ring 23.

At the same time, the seal projection 54 of the inner partition wall (for example, the fifth partition wall 14b) is pushed against the seal groove 51e formed in the outer peripheral surface 51b of the ring inclined portion 51 of the inner coupling ring 23 by the inner peripheral surface 51a of the ring inclined portion 51 of the intermediate coupling ring 23, and the seal projection 54 of the outer partition wall (for example, the partition wall 14c) is pushed against the seal groove 51e formed in the outer peripheral surface 51b of the ring inclined portion 51 of the intermediate coupling ring 23 by the inner peripheral surface 51a of the ring inclined portion 51 of the outer coupling ring 23.

As a result, the gap between the inner partition wall 14 and the inner coupling ring 23 and the gap between the inner partition wall 14 and the intermediate coupling ring 23 are sealed, and the gap between the outer partition wall 14 and the intermediate coupling ring 23 and the gap between the outer partition wall 14 and the outer coupling ring 23 are sealed. As described with reference to FIG. 8, the pressing projection 51f for pressing the seal projection 54 against the seal groove 51e may be formed in the inner peripheral surface 51a of the ring inclined portion 51 of the coupling ring 23.

The seal projection 54 of the side wall 15 is pushed against the seal groove 51e formed in the outer peripheral surface 51b of the ring inclined portion 51 of the first coupling ring 23f by the lower surface 43d (see FIG. 10) of the carrier 43, whereby the gap between the side wall 15 and the first coupling ring 23f and the gap between the side wall 15 and the carrier 43 are sealed.

The annular pressing projection 51f described with reference to FIG. 8 may be arranged on the lower surface 43d of the carrier 43. When connecting the elastic membrane 10 to the head body 2, the seal projection 54 of the side wall 15 is pressed against the seal groove 51e formed in the outer peripheral surface 51b of the ring inclined portion 51 of the first coupling ring 23f with a strong pressing force by the pressing projection 51f provided on the lower surface 43d.

In the present embodiment, the additional coupling ring 23g is fixed to the carrier 43 with a plurality of screws 94. A through hole 43f (see FIG. 10) into which the screw 94 is to be inserted is formed in the carrier 43, and a screw hole 56 extending from an upper surface to a lower surface of the additional coupling ring 23g is formed in the additional coupling ring 23g. By inserting the screw 94 into the through hole 43f and screwing the screw 94 into the screw hole 56, the additional coupling ring 23g is firmly fixed to the carrier 43.

At this time, the seal projection 54 of the sixth partition wall 14a is pressed against the seal groove 53a formed in the inclined surface 53 of the additional coupling ring 23g by the inner peripheral surface 51a of the ring inclined portion 51 of the sixth coupling ring 23a. As a result, the gap between the sixth partition wall 14a and the additional coupling ring 23g and the gap between the sixth partition wall 14a and the sixth coupling ring 23a are sealed.

Figure 14:
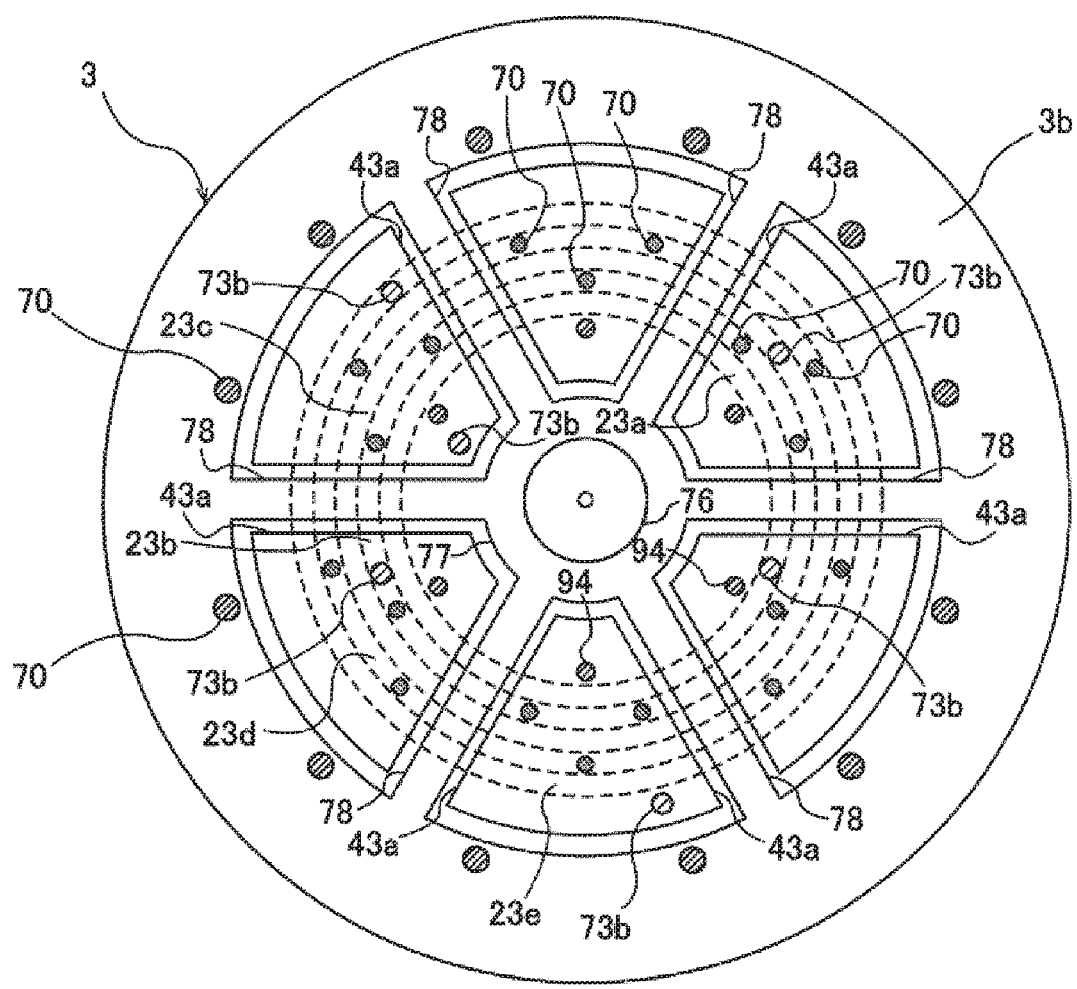
FIG. 14 is a schematic view illustrating an example of arrangement of the fixtures according to the embodiment of the present invention.

FIG. 14 is a schematic view illustrating an example of arrangement of the fixtures 70. As illustrated in FIG. 14, the sixth coupling ring 23a, the fifth coupling ring 23b, and the fourth coupling ring 23c are fixed to the carrier 43 with the plurality of fixtures 70 arranged along the peripheral direction of the fifth coupling ring 23b. The fourth coupling ring 23c, the second coupling ring 23d, and the second coupling ring 23e are fixed to the carrier 43 with the plurality of fixtures 70 arranged along the peripheral direction of the third coupling ring 23d.

In this manner, when the three or four coupling rings 23 are simultaneously fixed to the carrier 43 using the above-described fixtures 70, the elastic membrane 10 can be fixed to the head body 2 even if the width in the radial direction of each of the pressure chambers 16a to 16f is small. Further, the number of fixtures 70 can be reduced, and therefore, the work amount of attaching/detaching the elastic membrane 10 can be decreased.

As illustrated in FIG. 14, the carrier 43 includes the seal member 44 (see FIG. 5) for preventing leakage of the fluid flowing through the plurality of through holes 73a and 73b of the fluid line 73 for supplying the fluid to each of the pressure chambers 16a to 16f. Further, as described with reference to FIG. 3, the carrier 43 includes the plurality of radial grooves 43 in which the spokes 78 are accommodated.

When the three coupling rings 23 are fixed to the carrier 43 of the head body 2 by the fixtures 70 in order to connect two adjacent partition walls 14 to the head body 2 as like the present embodiment, the fixtures 70 can be easily arranged in positions different from the through holes 73b and the grooves 43a. Further, the number of fixtures 70 can be reduced. Therefore, attachment/detachment of the elastic membrane 10 becomes easy.

In the above-described embodiment, at least two adjacent partition walls among the plurality of partition walls 14 are constituted as the inclined partition walls inclined inward in the radial direction. The shapes of the partition walls 14 other than the partition walls 14 constituted as the inclined partition walls are arbitrary. For example, the partition walls 14d and 14e may be constituted as the inclined partition walls, and the partition walls 14a to 14c other than the partition walls 14d and 14e may be constituted as partition walls including an inclined portion inclined inward in the radial direction from the contact portion 11 and a horizontal portion horizontally extending from the inclined portion.

In the present embodiment, as described above, regarding the edge pressure chamber 16f located on the outermost side among the plurality of pressure chambers formed between the elastic membrane 10 and the head body 2, the first partition wall 14f and the second partition wall 14e, which are the partition walls constituting the edge pressure chamber 16f, are formed into the straight shape, and the interval between the first partition wall 14f and the second partition wall 14e is constituted to gradually increase from the inside toward the outside in the radial direction of the contact portion 11. With such constitution of the edge pressure chamber 16f, various effects can be obtained.

FIGS. 15 to 20 are schematic views for describing the effect by the above-described constitution of the edge pressure chamber 16f. As in a conventional example illustrated in FIG. 15B, if partition walls 214f and 214e constituting a pressure chamber 216f extend in parallel, and an interval therebetween is narrow, a pressure in an edge pressure chamber 216e becomes larger than a pressure in the pressure chamber 216f. If the differential pressure is large, as illustrated in FIG. 15C, the pressure chamber 216e is expanded, the partition wall 214e is deformed, and the partition wall 214e and the partition wall 214f may come in contact with each other.

Figure 15A:
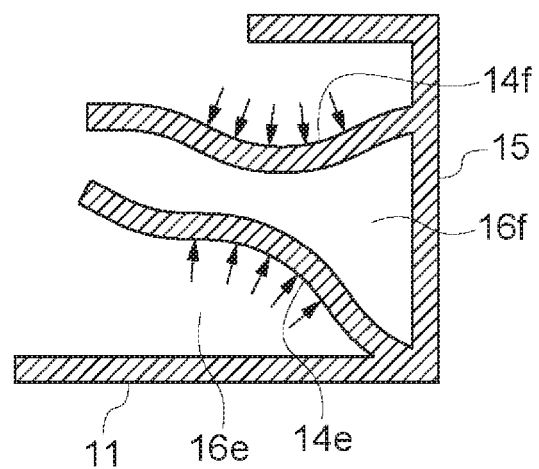
FIG. 15A is a schematic view for describing advantages of the elastic membrane according to the embodiment of the present invention.
Figure 15B:
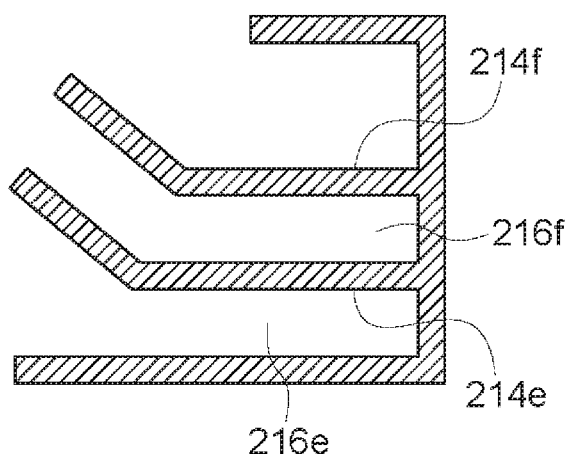
FIG. 15B is a schematic view illustrating a conventional elastic membrane.
Figure 15C:
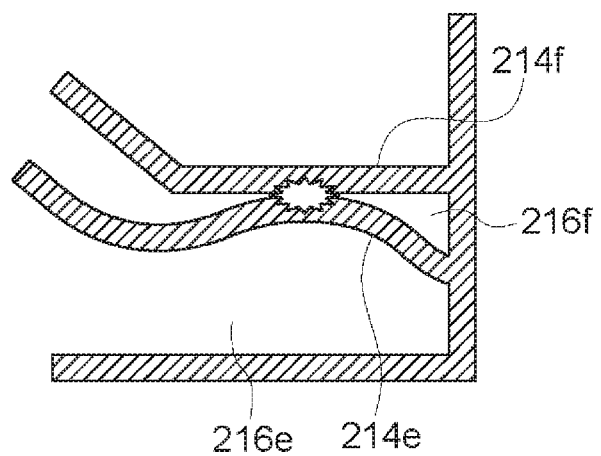
FIG. 15C is a schematic diagram for describing problems of the conventional elastic membrane.

When the partition wall 214e and the partition wall 214f come in contact with each other as illustrated in FIG. 15C, the pressure in the pressure chamber 216f on an outer side of a contact portion cannot be accurately controlled, and therefore a pressing force by an elastic membrane 10 applied to an edge portion of a wafer W cannot be accurately controlled.

In contrast, in the elastic membrane 10 of the present embodiment, the first partition wall 14f and the second partition wall 14e have the straight shape, and the interval between the first partition wall 14f and the second partition wall 14e are gradually increased from the inside to the outside in the radial direction of the contact portion 11. Therefore, as illustrated in FIG. 15A, the pressure in the edge pressure chamber 16f becomes smaller than the pressure in the pressure chamber 16e, and the first partition wall 14f and the second partition wall 14e are less likely to come in contact with each other even if the differential pressure becomes large. Therefore, the pressure in the edge pressure chamber 16f can be precisely adjusted, and the pressing force against the edge portion of the wafer W can also be precisely adjusted.

Figure 16A:
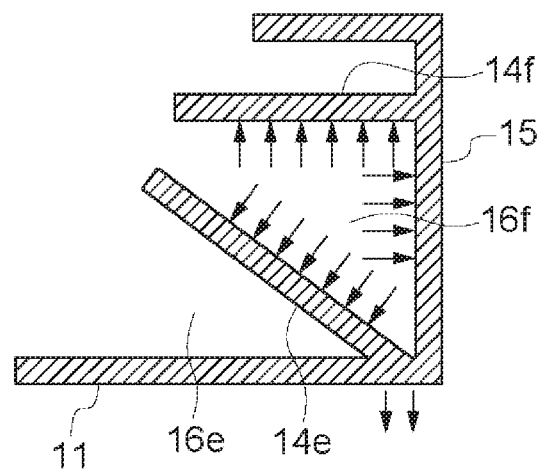
FIG. 16A is a schematic view for describing advantages of the elastic membrane according to the embodiment of the present invention.
Figure 16B:
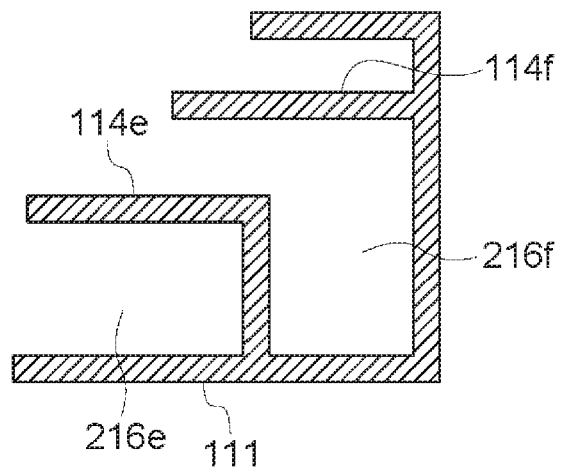
FIG. 16B is a schematic view illustrating a conventional elastic membrane.
Figure 16C:
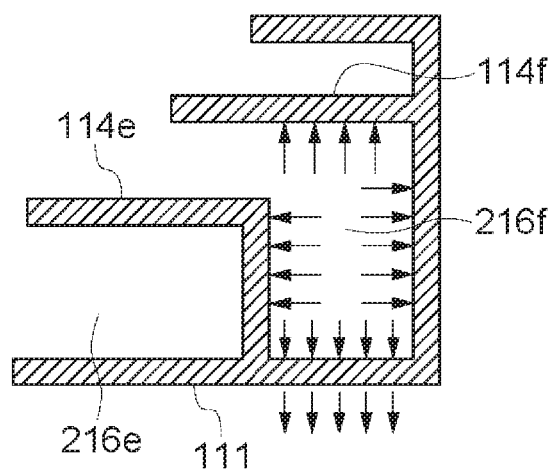
FIG. 16C is a schematic diagram for describing problems of the conventional elastic membrane.

Further, as in a conventional example illustrated in FIG. 16B, if a distance (edge pressing width) between a connection portion between a second partition wall 114e and an upper surface of a contact portion 111 and an outer peripheral end of the contact portion 111 is large, a pressing force cannot be controlled in a fine range in an edge portion of an elastic membrane 10, as illustrated in FIG. 16C, and problems such as edge sagging may occur.

In contrast, in the elastic membrane 10 of the present embodiment, as illustrated in FIG. 16A, the connection portion between the partition wall 14e that is the lower partition wall constituting the edge pressure chamber 16f and the contact portion 11 is located in the place close to the outer peripheral end of the contact portion 11, and the partition wall 14e extends from the outer peripheral end portion of the contact portion 11. Therefore, the edge pressing width becomes small, and the pressing force can be controlled in a fine range in the edge portion of the elastic membrane 10.

Figure 17A:
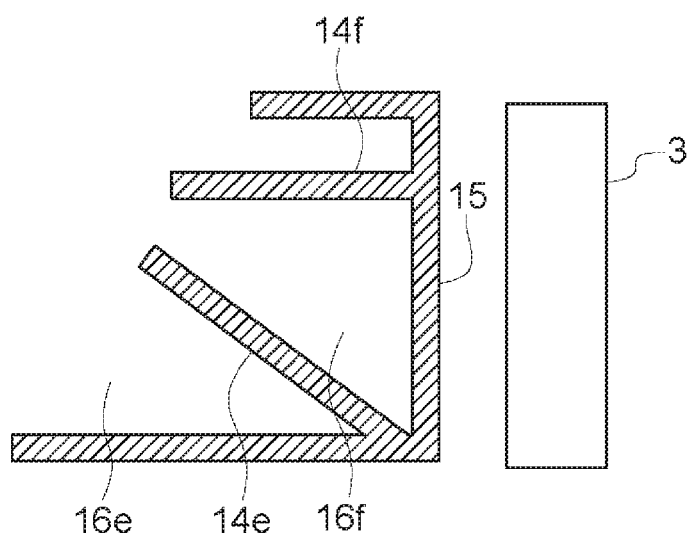
FIG. 17A is a schematic view for describing advantages of the elastic membrane according to the embodiment of the present invention.
Figure 17B:
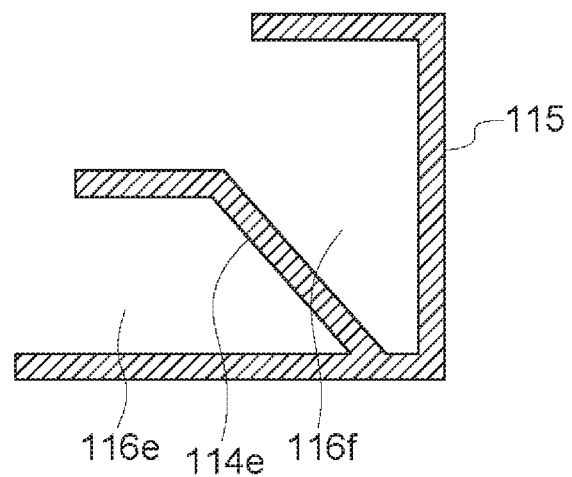
FIG. 17B is a schematic view illustrating a conventional elastic membrane.
Figure 17C:
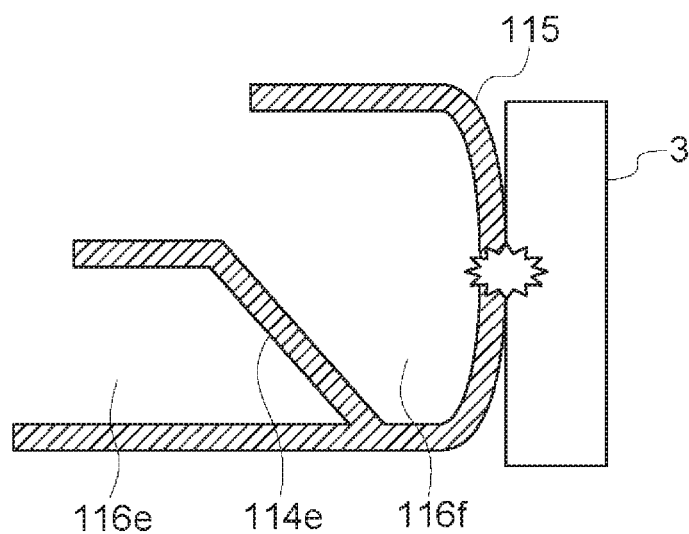
FIG. 17C is a schematic diagram for describing problems of the conventional elastic membrane.

Further, as in a conventional example illustrated in FIG. 17B, if a portion of a side wall 115, the portion forming an edge pressure chamber 116f, is long, when a pressure in the edge pressure chamber 116f is increased, a side wall 115 is expanded outward in a radial direction in the edge pressure chamber 116f and comes into contact with a retainer ring 3, as illustrated in FIG. 17C, and a pressing force of an edge portion becomes unstable, and a polishing rate at an edge portion of a wafer W may become unstable.

In contrast, in the elastic membrane 10 of the present embodiment, as illustrated in FIG. 17A, the straight partition wall 14f is connected to the side wall 15. Therefore, even if the pressure in the edge pressure chamber 16f becomes high, the partition wall 14f suppresses the expansion of the side wall 15, and thus the side wall 15 is less likely to come in contact with the retainer ring 3. Therefore, in the elastic membrane 10 of the present embodiment, the pressing force of the edge portion is stabilized, and the polishing rate at the edge portion of the wafer W becomes stabilized.

Figure 23:
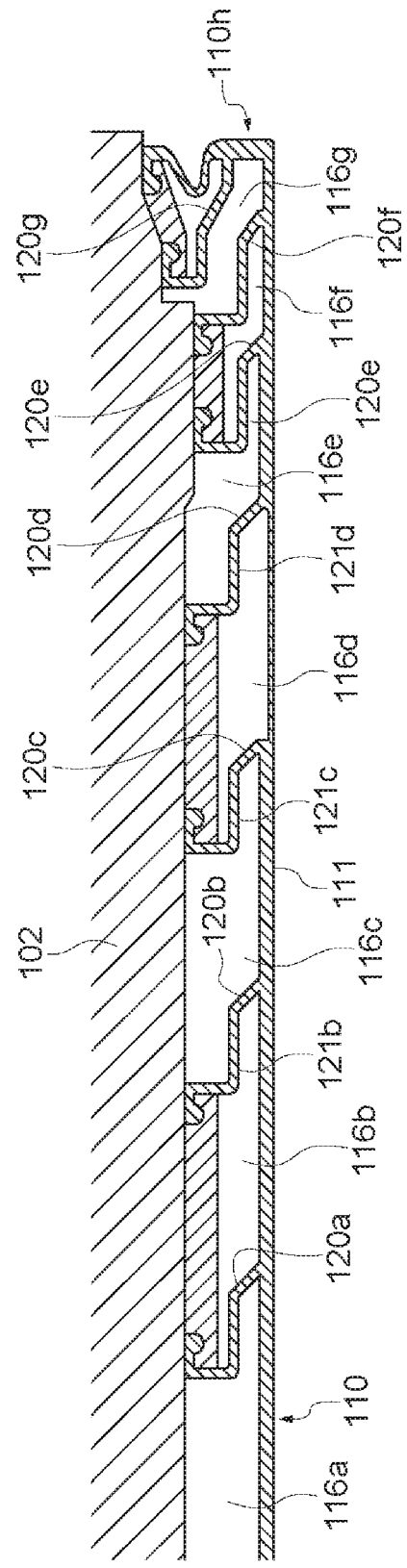
FIG. 23 is a sectional view illustrating a substrate holding device of a conventional polishing apparatus.
Figure 24:
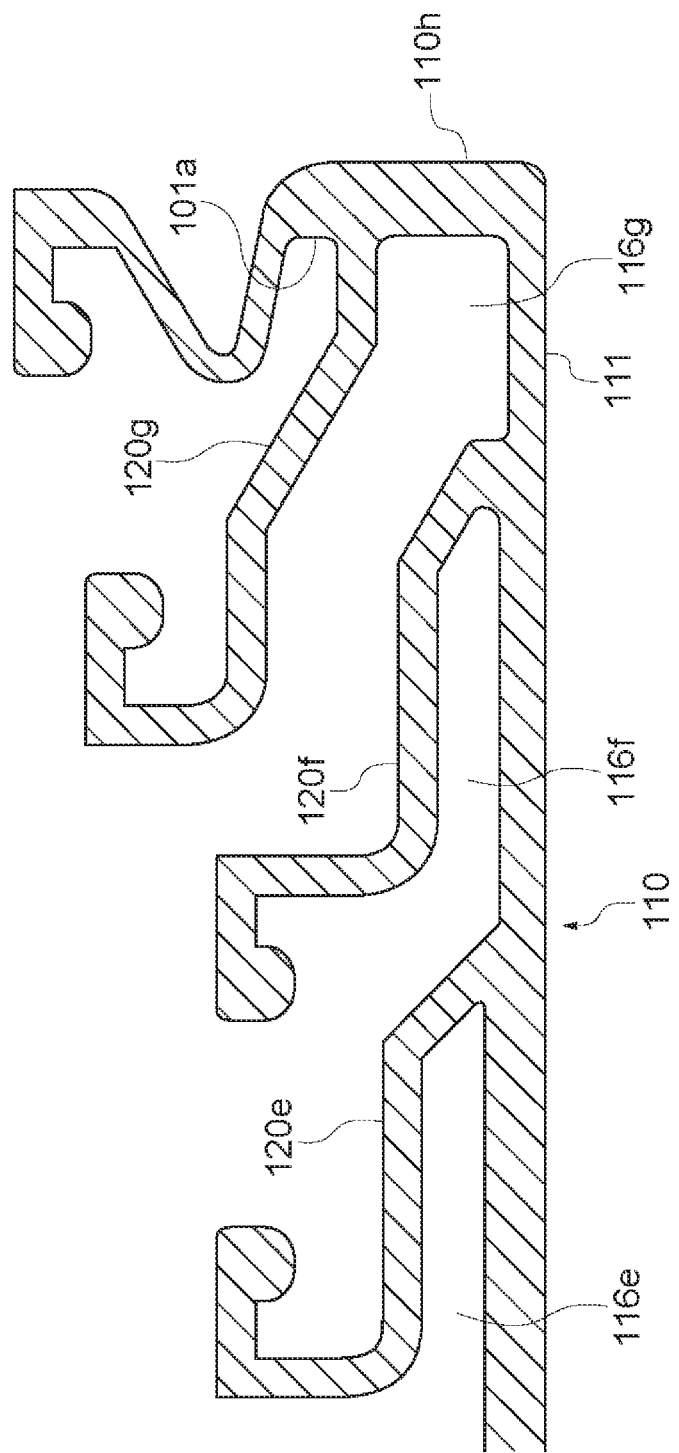
FIG. 24 is an enlarged sectional view illustrating a part of a conventional elastic membrane.
Figure 25:
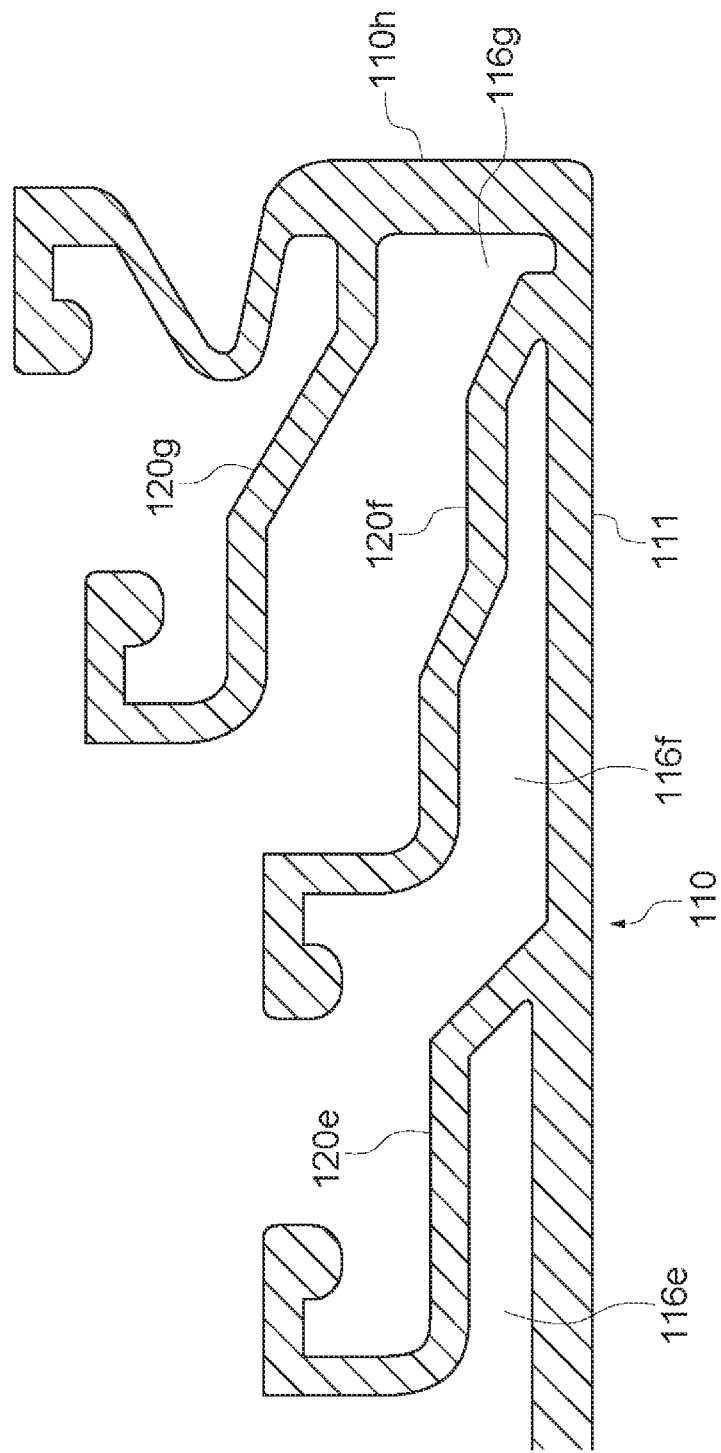
FIG. 25 is an enlarged sectional view illustrating a part of a conventional elastic membrane according to another example.

Note that, in conventional examples illustrated in FIGS. 23 and 24, a partition wall 120g corresponding to the partition wall 14f of the elastic membrane 10 of the present embodiment is connected to a side wall 110h. However, the partition wall 120g does not have a straight shape and a partition wall 120f is also bent. Therefore, the bent portions are stretched to become flat as a pressure in an edge pressure chamber 116g is increased, and the side wall 110h may be expanded outward in a radial direction.

In contrast, in the elastic membrane 10 of the present embodiment, as illustrated in FIG. 17A, the partition wall 14f connected to the side wall 15 has a straight shape, and thus a space to extend outward in the radial direction is extremely small for the partition wall 14f, and the expansion of the side wall 15 can be effectively suppressed.

Figure 18A:
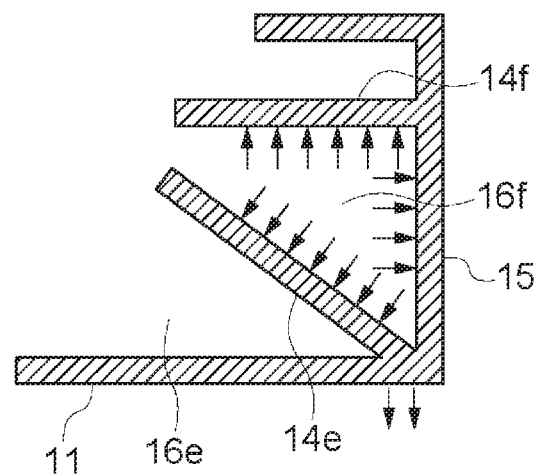
FIG. 18A is a schematic view for describing advantages of the elastic membrane according to the embodiment of the present invention.
Figure 18B:
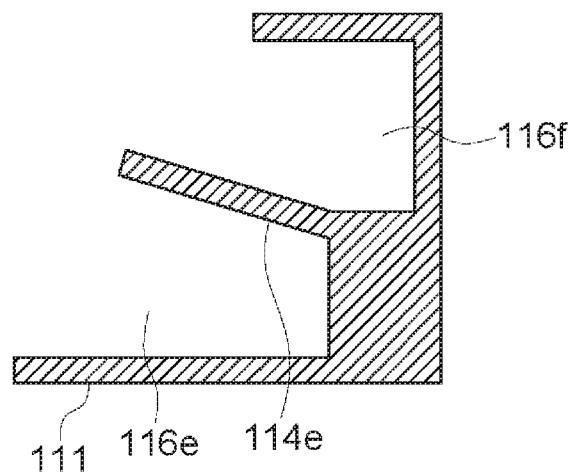
FIG. 18B is a schematic view illustrating a conventional elastic membrane.
Figure 18C:
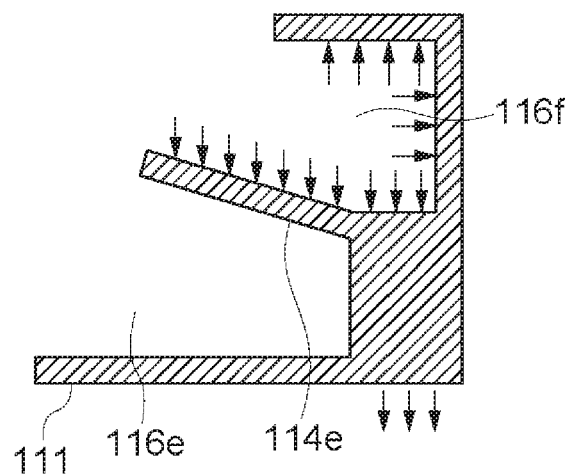
FIG. 18C is a schematic diagram for describing problems of the conventional elastic membrane.

Further, as in a conventional example illustrated in FIG. 18B, in a case where a cross section of an end portion of a contact portion 111 has a rectangular, a pressing force by a pressure in an edge pressure chamber 116f is given to a wafer W with a width of the rectangular, as illustrated in FIG. 18C. If so, the wafer W cannot be pressed in a narrow range in an edge portion, and precise adjustment of the pressing force cannot be performed in the edge portion.

In contrast, in the elastic membrane 10 of the present embodiment, as illustrated in FIG. 18A, the partition wall 14e is connected to the outer peripheral end portion of the contact portion 11, and thus the edge pressing width by the edge pressure chamber 16f can be made small, and the pressing force can be precisely adjusted in the edge portion.

Figure 19A:
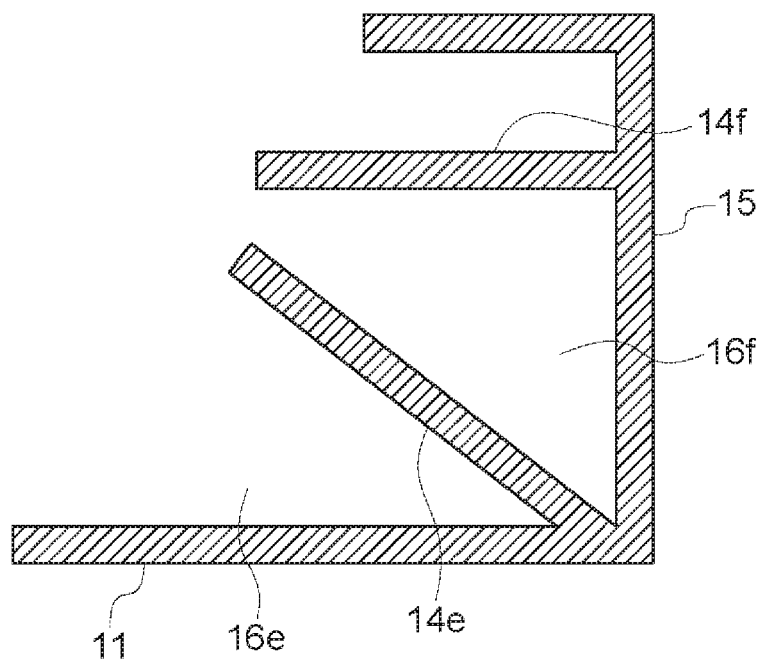
FIG. 19A is a schematic view for describing advantages of the elastic membrane according to the embodiment of the present invention.
Figure 19B:
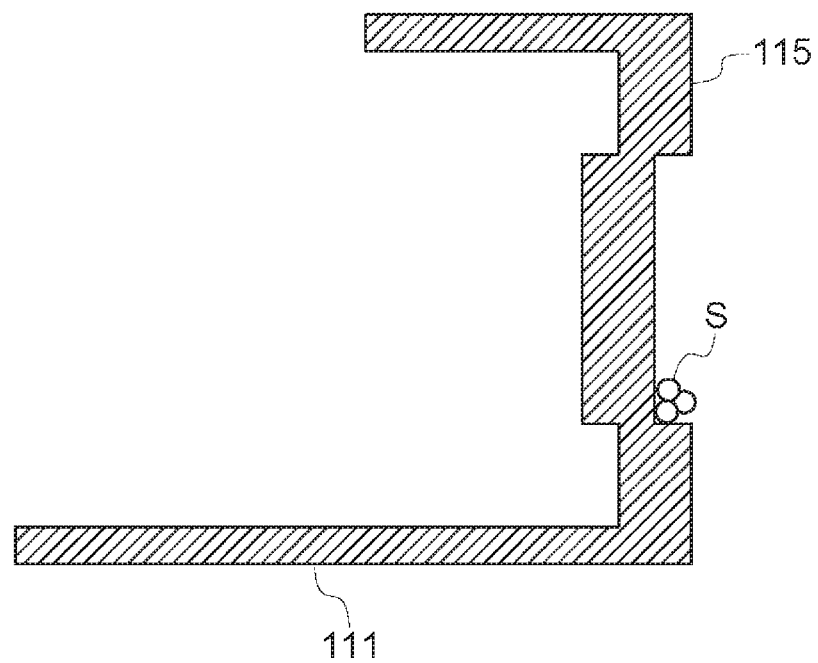
FIG. 19B is a schematic diagram for describing problems of the conventional elastic membrane.

Further, as in a conventional example illustrated in FIG. 19B, in a case where there is a step in a side wall 115, slurry S is easily accumulated in the step, which may become a cause of defect. In contrast, in the elastic membrane 10 of the present embodiment, as illustrated in FIG. 19A, the outer peripheral surface of the side wall 15 is flat, and thus slurry is not accumulated.

Figure 20A:
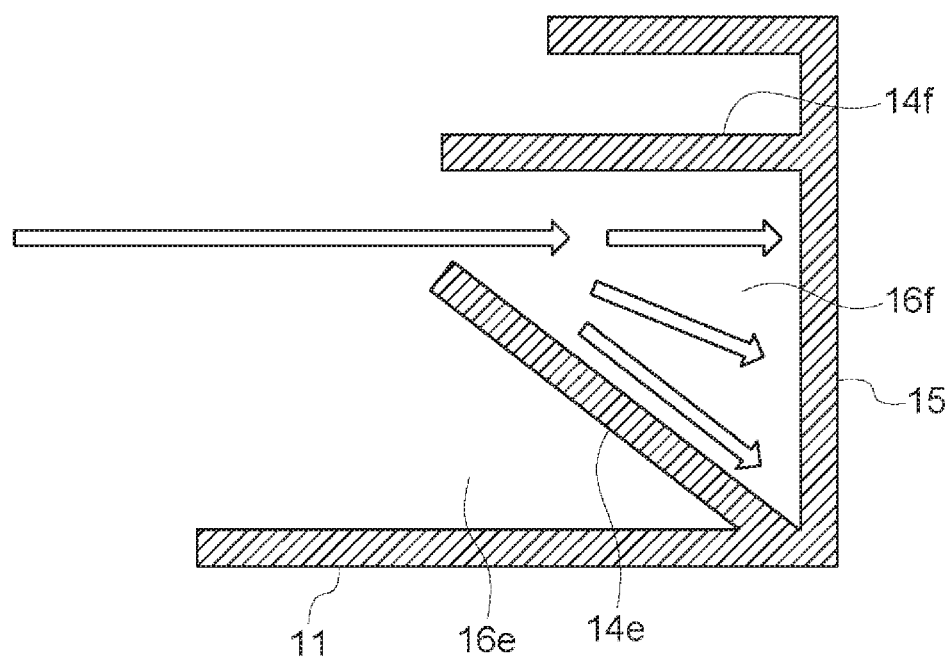
FIG. 20A is a schematic view for describing advantages of the elastic membrane according to the embodiment of the present invention.
Figure 20B:
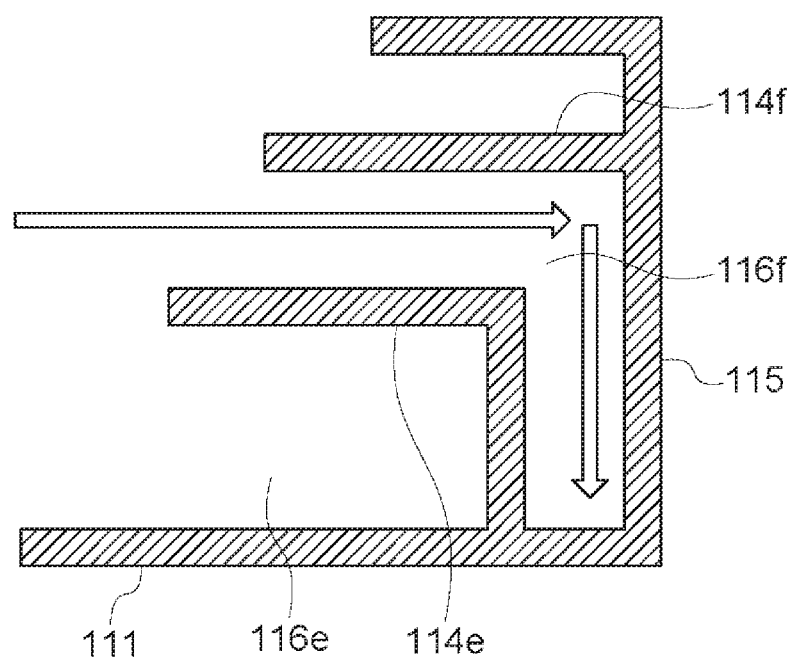
FIG. 20B is a schematic diagram for describing problems of the conventional elastic membrane.

Further, as in a conventional example illustrated in FIG. 20B, if a partition wall 114e constituting an edge pressure chamber 116f is bent and the edge pressure chamber 116f is bent accordingly, a pressure loss occurs at a bend angle, and a pressure does not reach an end of the edge pressure chamber 116f, that is, an outer peripheral end portion of a contact portion 111, and precise adjustment of a pressing force in an edge portion becomes difficult.

In contrast, in the elastic membrane 10 of the present embodiment, as illustrated in FIG. 20A, the interval between the first partition wall 14f and the second partition wall 14e becomes gradually wider and the edge pressure chamber 16f becomes broader from the inside in the radial direction, where the fluid line 73 as a fluid source for the edge pressure chamber 16f is located, toward the outside in the radial direction, which is a downstream side. Therefore, there is no obstruction on the path of the fluid, the fluid easily spreads to the entire edge pressure chamber 16f, and the pressing force can be precisely adjusted in the edge portion.

Figure 21A:
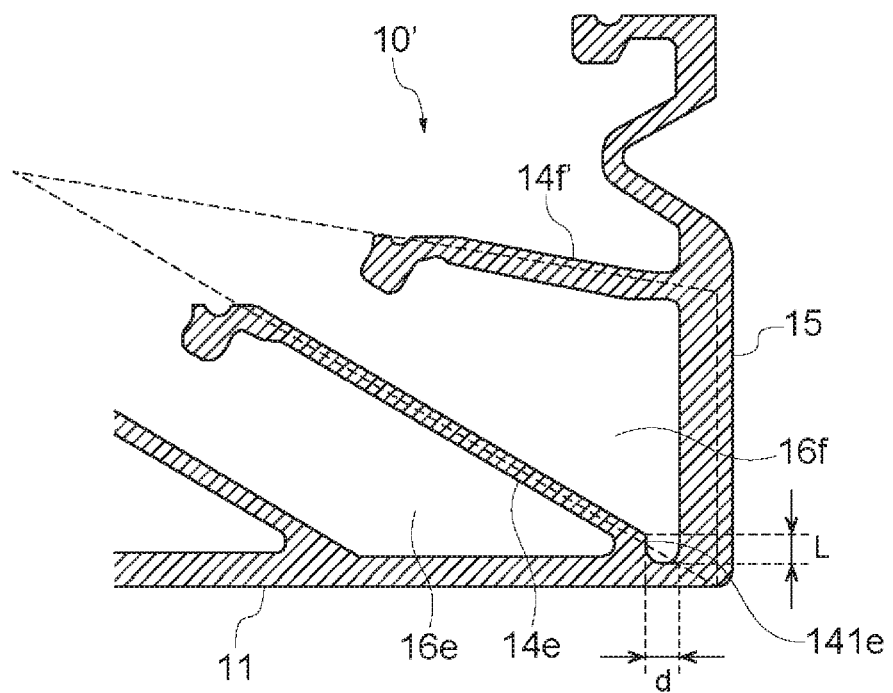
FIG. 21A is an enlarged sectional view illustrating a part of an elastic membrane according to a first modification of the embodiment of the present invention.

Next, modifications of the elastic membrane 10 of the present embodiment will be described. FIG. 21A is an enlarged sectional view illustrating a part of an elastic membrane according to a first modification. In the above embodiment, the upper partition wall 14f constituting the edge pressure chamber 16f horizontally extends from the side wall 15. However, in an elastic membrane 10' of the present modification, a partition wall 14f' is inclined slightly upward from an outside to an inside in the radial direction.

With the constitution of the present modification, the first partition wall 14f has a straight shape extending inward in the radial direction from the side wall 15, a second partition wall 14e has a straight shape extending inward and upward in the radial direction from an outer peripheral end portion of a contact portion 11, and the edge pressure chamber 16f is constituted by the first partition wall 14f, the second partition wall 14e, and the side wall 15. Therefore, similar effects to the above-described effects can be obtained. Note that the partition wall 14f may be inclined inward and upward in the radial direction until the partition wall 14f becomes parallel to or higher than the partition wall 14e.

Figure 21B:
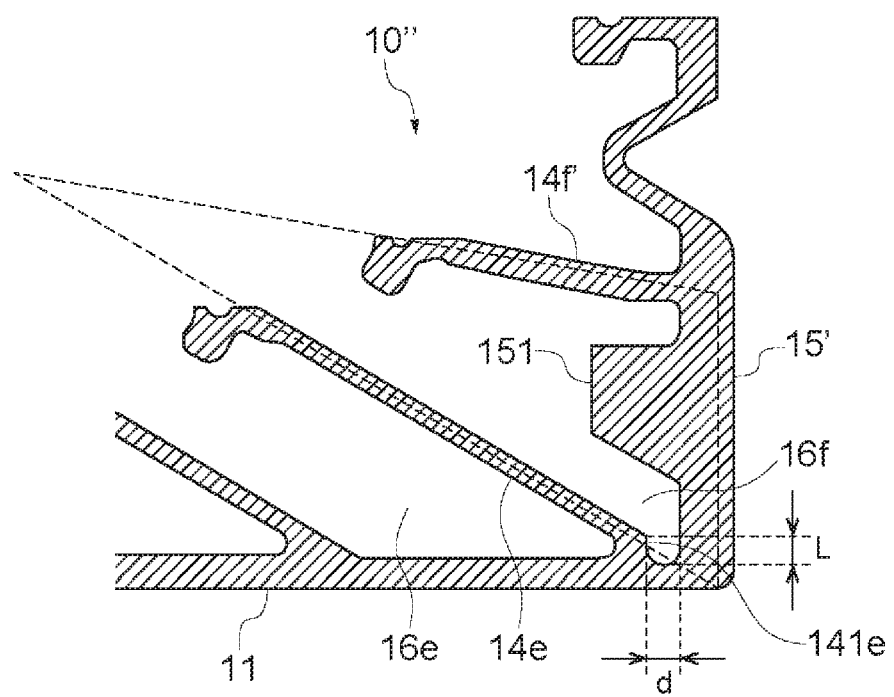
FIG. 21B is an enlarged sectional view illustrating a part of an elastic membrane according to a second modification of the embodiment of the present invention.

FIG. 21B is an enlarged sectional view illustrating a part of an elastic membrane according to a second modification. In an elastic membrane 10 of the present modification, a block 151 for suppressing expansion of a side wall 15' outward in a radial direction is formed inside the side wall 15' in addition to the constitution of FIG. 21A. Inside the side wall 15', the block 151 may continue in a peripheral direction to form an annular shape or a plurality of blocks 151 may be provided at intervals in the peripheral direction.

With the constitution of the present modification, the first partition wall 14f has a straight shape extending inward in the radial direction from the side wall 15, a second partition wall 14e has a straight shape extending inward and upward in the radial direction from an outer peripheral end portion of a contact portion 11, and the edge pressure chamber 16f is constituted by the first partition wall 14f, the second partition wall 14e, and the side wall 15. Therefore, similar effects to the above-described effects can be obtained.

Note that the second partition wall 14e of the elastic membrane illustrated in FIGS. 21A and 21B is bent in a vertical direction at its proximal end portion to form a proximal end connection portion 141e, and the proximal end connection portion 141e is connected to an upper surface of the contact portion 11. A distance (corresponding to the above edge pressing width d) between an outer peripheral surface of the proximal end connection portion 141e and an inner peripheral surface of the side wall 15 may be 1.5 to 8 mm (favorably 3 to 6 mm).

In the case where the second partition wall 14e is formed from a position on an inner side by the distance d from the outer peripheral end of the contact portion 11 as above, such a second partition wall 14e corresponds to the partition wall extending from the outer peripheral end portion of the contact portion 11. Further, a length L of the proximal end connection portion 141e may be 0.5 to 3.5 mm (favorably about 1 to 2.5 mm). Even with the second partition wall 14e formed with such a proximal end connection portion 141e, most part of a partition wall body 55 is linearly formed, and the second partition wall 14e corresponds to the linearly extending partition wall.

Figure 22:
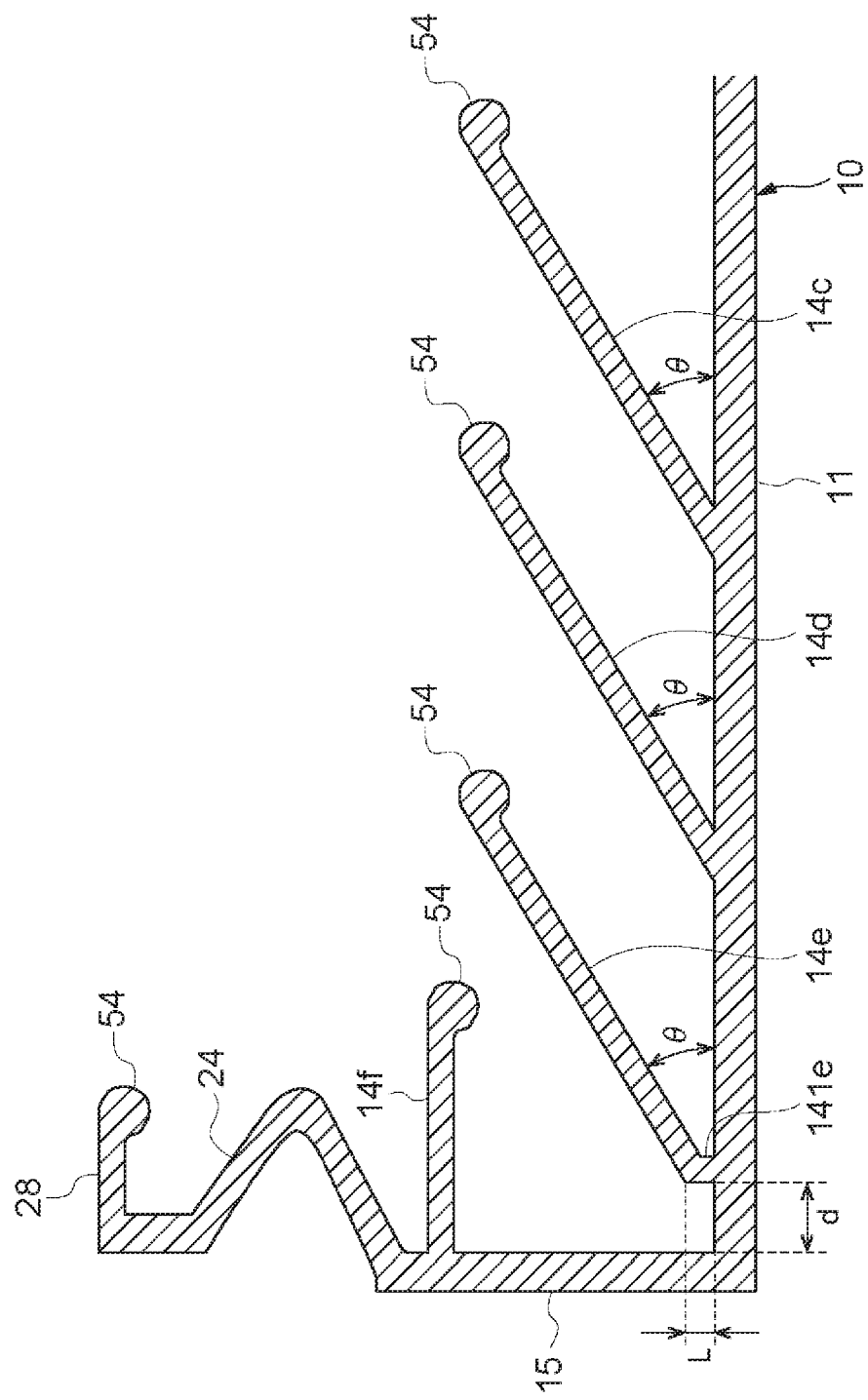
FIG. 22 is an enlarged sectional view illustrating a part of an elastic membrane according to a third modification of the embodiment of the present invention.

FIG. 22 illustrates a view illustrating an example having a clearer distance d and length L as a third modification. In the modification illustrated in FIG. 22, the distance d between an outer peripheral surface of a proximal end connection portion 141e and an inner peripheral surface of a side wall 15 is 5 mm, and the length L of the proximal end connection portion 141e is 3 mm. That is, in this example, a very small (a width of 5 mm) portion of an outer peripheral end portion of a contact portion 11 constitutes an edge pressure chamber 16f.

In the case where a metal film of copper or tungsten is formed on a wafer W, the filmed area is located at a position inside an outer periphery of the wafer W, and the film may not be formed on an outer peripheral end portion of the wafer W. In such a case, a polishing profile of a portion slightly inside an outer peripheral end of the wafer W, that is, the outer peripheral end portion of the film needs to be precisely controlled.

According to the above-described modification, the polishing process of the outer peripheral end portion of the film formed on the wafer W can be precisely controlled by securing the distance d to some extent. Further, by forming the proximal end connection portion 141e, the position and posture of the portion of the second partition wall 14e other than the proximal end connection portion 141e can be made similar to those of the second partition wall 14e of the above embodiment illustrated in FIG. 6.

That is, if the second partition wall 14e of FIG. 6 is translated inward as it is, the distance between the second partition wall 14e and the third partition wall 14d becomes narrow. However, the proximal end portion of the second partition wall 14e is bent to form the proximal end connection portion 141e, thereby securing the edge pressing width d while securing the distance between the second partition wall 14e and the third partition wall 14d similarly to the above-described embodiment. The function and effect described in the above embodiment can be obtained as long as the edge pressing width d is 8 mm or less and the length L is 3.5 mm or less.

The above-described embodiments have been described for the purpose of enabling a person having ordinary knowledge in the technical field to which the present invention belongs to implement the present invention. Various modifications of the above embodiments can naturally be made by those skilled in the art, and the technical idea of the present invention can be applied to other embodiments. Therefore, the present invention is not limited to the described embodiments and is rather construed in the broadest scope in accordance with the technical idea defined by the claims.

What is claimed is:

1. An elastic membrane to be used for a substrate holding device, the substrate holding device having a head body to which the elastic membrane is attachable, the elastic membrane comprising:
   a contact portion configured to come into contact with a substrate;
   an annular side wall provided to stand on an outer peripheral end of the contact portion;
   a first partition wall extending inward in a radial direction in sectional view from the side wall and including a first engaging portion on a distal end to be engaged with the head body;
   a second partition wall extending inward and upward in the radial direction in sectional view from an outer peripheral end portion of the contact portion and including a second engaging portion on a distal end to be engaged with the head body; and
   a third partition wall linearly extending inward and upward in the radial direction in sectional view and provided inner side of the second partition wall, wherein
   the first partition wall, the second partition wall, and the annular side wall constitute an edge pressure chamber for pressing an edge of the substrate, wherein an interval between the first partition wall and the second partition wall gradually increases from the first engaging portion and the second engaging portion toward the side wall and wherein the second partition wall and the third partition wall constitute an intermediate pressure chamber.

2. The elastic membrane according to claim 1, wherein the first partition wall and upper portion of the annular side wall constitute an upper edge pressure chamber, an outer surface of the upper portion of the annular side wall is concave.

3. The elastic membrane according to claim 2, wherein the upper portion of the annular side wall has a bent portion that bents inward in the radial direction in a protruding manner to makes the outer surface concave.

4. The elastic membrane according to claim 1, wherein the third partition wall extends substantially parallel to the second partition wall.

* * * * *